(12) United States Patent
Akahane

(10) Patent No.: US 10,511,298 B2
(45) Date of Patent: Dec. 17, 2019

(54) DRIVING CIRCUIT

(71) Applicant: FUJI ELECTRIC CO., LTD., Kanagawa (JP)

(72) Inventor: Masashi Akahane, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 70 days.

(21) Appl. No.: 15/499,931

(22) Filed: Apr. 28, 2017

(65) Prior Publication Data
US 2017/0237422 A1 Aug. 17, 2017

Related U.S. Application Data

(63) Continuation of application No. PCT/JP2016/059959, filed on Mar. 28, 2016.

(30) Foreign Application Priority Data

May 15, 2015 (JP) ................................. 2015-099850

(51) Int. Cl.
*H03B 1/00* (2006.01)
*H03K 3/00* (2006.01)
*H03K 17/0812* (2006.01)
*H03K 3/037* (2006.01)
*H03K 17/18* (2006.01)
*H03K 17/22* (2006.01)
(Continued)

(52) U.S. Cl.
CPC ....... *H03K 17/08122* (2013.01); *H03K 3/033* (2013.01); *H03K 3/037* (2013.01); *H03K 17/163* (2013.01); *H03K 17/18* (2013.01); *H03K 17/223* (2013.01); *H03K 19/018507* (2013.01); *H03K 5/1252* (2013.01); *H03K 2017/0806* (2013.01)

(58) Field of Classification Search
CPC .. H03K 17/08122; H03K 3/037; H03K 17/18; H03K 17/223; H03K 19/018507
USPC .................................................. 327/108–112
See application file for complete search history.

(56) References Cited

U.S. PATENT DOCUMENTS 5,917,359 A 6/1999 Fukunaga et al.
2002/0014905 A1 2/2002 Kumagai
(Continued)

FOREIGN PATENT DOCUMENTS

JP H09-200017 A 7/1997
JP 2000-252809 A 9/2000
(Continued)

OTHER PUBLICATIONS

International Search Report for International Patent Application No. PCT/JP2016/059959, issued by the Japan Patent Office dated Jun. 7, 2016.

*Primary Examiner* — Metasebia T Retebo

(57) ABSTRACT

Voltage surge is prevented when the output from a driver of a driving circuit performs a hard shutdown. In this manner, the elements in the driving circuit are prevented from being damaged by the voltage surge. A driving circuit includes a level shift circuit configured to convert an input signal from a preceding-stage circuit into an output signal having a higher voltage than the input signal, and a controller configured to determine whether a switch element is to perform a soft shutdown based on a state signal indicating a state of the preceding-stage circuit. Here, the driving circuit is configured to drive the switch element.

10 Claims, 14 Drawing Sheets

(51) Int. Cl.
    *H03K 19/0185*    (2006.01)
    *H03K 3/033*      (2006.01)
    *H03K 17/16*      (2006.01)
    H03K 5/1252       (2006.01)
    H03K 17/08        (2006.01)

(56) References Cited

U.S. PATENT DOCUMENTS

| | | | |
|---|---|---|---|
| 2004/0120090 A1* | 6/2004 | Galli | H02M 1/32 |
| | | | 361/115 |
| 2011/0074485 A1 | 3/2011 | Yamamoto | |
| 2013/0088096 A1 | 4/2013 | Hashimoto et al. | |
| 2015/0061749 A1* | 3/2015 | Nam | H03K 17/08128 |
| | | | 327/398 |

FOREIGN PATENT DOCUMENTS

| | | |
|---|---|---|
| JP | 2008-029060 A | 2/2008 |
| JP | 2011-077629 A | 4/2011 |
| JP | 2013-055739 A | 3/2013 |
| WO | 2011/129263 A1 | 10/2011 |

\* cited by examiner 241, 247

245

DRIVING CIRCUIT

The contents of the following Japanese patent application(s) are incorporated herein by reference:
NO. 2015-099850 filed in JP on May 15, 2015, and
NO. PCT/JP2016/059959 filed on Mar. 28, 2016.

BACKGROUND

Technical Field

The present invention relates to a driving circuit.

A level shift circuit included in a driving circuit is configured to convert a low-voltage signal into a high-voltage signal, based on which a switch element such as a transistor is controlled. When the switch element is turned off, a hard shutdown is performed (see, for example, Japanese Patent Application Publication No. 9-200017 and U.S. Pat. No. 5,917,359).

If the drive output of the driving circuit performs a hard shutdown, voltage surge occurs as a result of the turning-off of the switch element.
The voltage surge may disadvantageously damage the elements in the driving circuit.

SUMMARY

A first aspect of the innovations herein provides a driving circuit. The driving circuit may include a level shift circuit and a controller. The level shift circuit may be configured to convert an input signal from a preceding-stage circuit into a signal having a higher voltage than the input signal. The controller may be configured to output a signal to allow a first switch element to perform a soft shutdown based on an output signal from the level shift circuit. The driving circuit may be configured to drive the first switch element.

The preceding-stage circuit may include an abnormality detecting circuit. The controller may determine whether the first switch element is to perform a soft shutdown based on an output signal from the abnormality detecting circuit.

The first switch element may be switched on or off according to a control signal input thereinto. The driving circuit may further include a latch circuit. The latch circuit may be configured to generate the control signal according to a set signal and a reset signal that are input from the preceding-stage circuit to the level shift circuit. The controller may determine whether the first switch element is to perform a soft shutdown based on an output from the latch circuit and a state signal generated based on the output signal from the abnormality detecting circuit.

The controller may allow the first switch element to perform a soft shutdown when the output signal from the latch circuit indicates that the first switch element is to be switched on and the state signal indicates that abnormality is detected in the preceding-stage circuit.

The set signal may indicate a predetermined logical value when the first switch element is to be switched on. The reset signal may indicate a predetermined logical value when the first switch element is to perform a hard shutdown. The state signal may indicate a predetermined logical value when abnormality is detected in the preceding-stage circuit. The driving circuit may further include an anti-error circuit configured to, except when the first switch element performs a soft shutdown, maintain the first switch element switched on or off when two or more of the set signal, the reset signal and the state signal indicate the predetermined logical values.

The level shift circuit may include a state signal input circuit, a set signal input circuit and a reset signal input circuit. The state signal input circuit may be configured to shift a level of the state signal. The set signal input circuit may be configured to shift a level of the set signal. The reset signal input circuit may be configured to shift a level of the reset signal. The state signal input circuit, the set signal input circuit and the reset signal input circuit may each include a resistance element connected to a high-potential side of the driving circuit and a transistor having a drain connected to a low-potential side of the resistance element. In the state signal input circuit, the set signal input circuit and the reset signal input circuit, high-potential sides of the resistance elements may be connected to each other and the resistance elements may have a same resistance value and the transistors may have a same characteristic.

The preceding-stage circuit may determine whether the first switch element is to perform a soft shutdown based on a signal input from outside and designed to control the first switch element and the output signal from the abnormality detecting circuit.

The preceding-stage circuit may output to the level shift circuit a state signal designed to allow the first switch element to perform a soft shutdown when the signal input from outside and designed to control the first switch element indicates that the first switch element is to be switched on and the output signal from the abnormality detecting circuit indicates that abnormality is detected.

The controller may control the first switch element to start a hard shutdown after a predetermined period of time has elapsed after the first switch element starts a soft shutdown.

The controller may determine the predetermined period of time depending on a type of an abnormality detected in the preceding-stage circuit.

The controller may determine a time constant of a soft shutdown depending on a type of an abnormality detected in the preceding-stage circuit.

The preceding-stage circuit may include a low-side control circuit. The low-side control circuit may be configured to switch on or off a second switch element that is connected in series with a low-potential side of the first switch element. The abnormality detecting circuit may include a circuit configured to detect a state of the second switch element.

The summary clause does not necessarily describe all necessary features of the embodiments of the present invention. The present invention may also be a sub-combination of the features described above.

DESCRIPTION OF THE EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
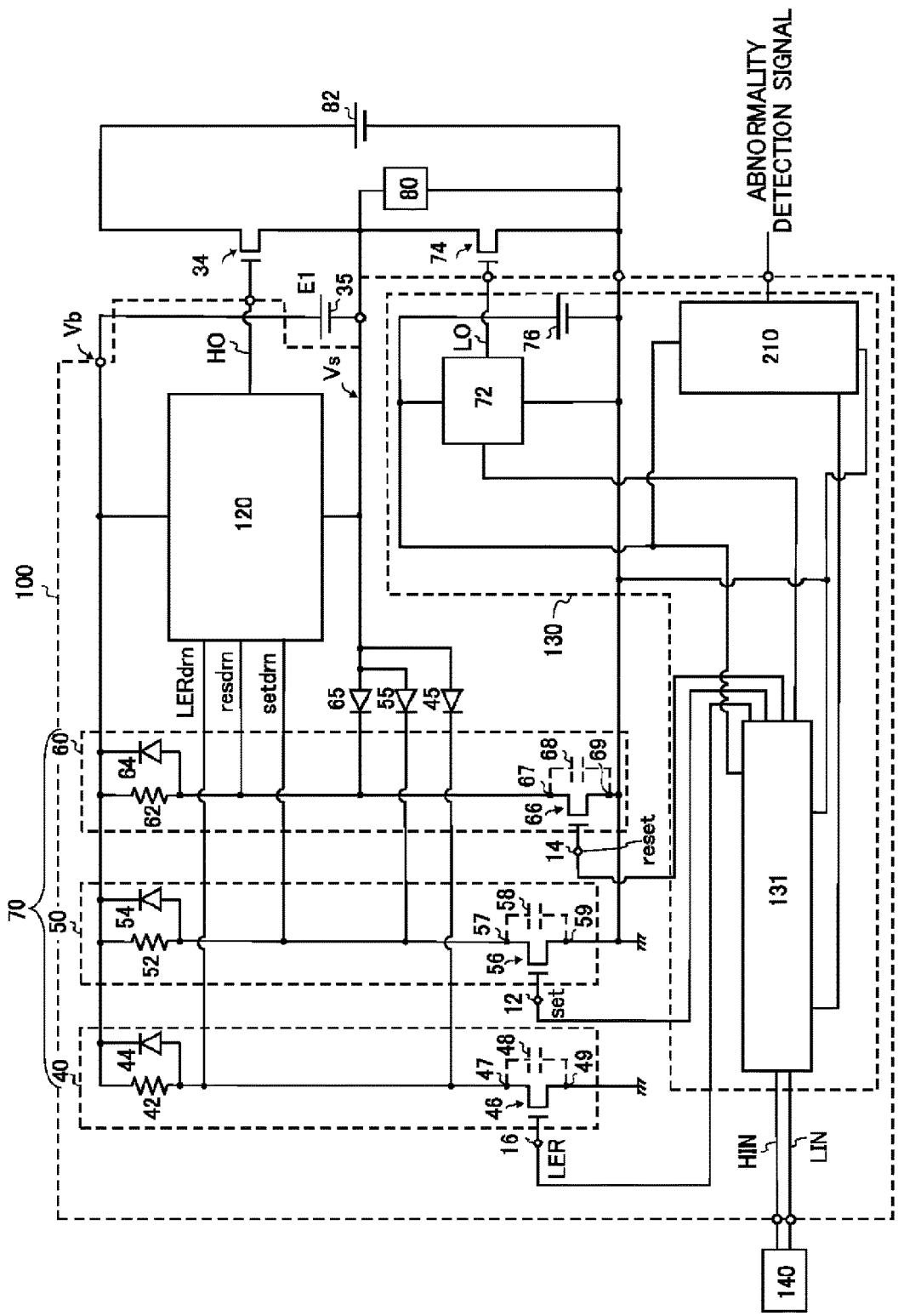
FIG. 1 shows a driving circuit 100, a load 80 and a power source 82, and transistors 34 and 74.

FIG. 1 shows a driving circuit 100, a load 80 and a power source 82, and a transistor 34, which is a first switch element, and a transistor 74, which is a second switch element. The driving circuit 100 includes a level shift circuit 70, a high-side control circuit 120, and a low-side control circuit 130, which is a preceding-stage circuit. Note that the constituents of the driving circuit 100 of the present example are integrated in a single semiconductor chip. As described in alternative examples, however, the high-side control circuit 120 and the preceding-stage circuit may be formed in a separate semiconductor chip.

The level shift circuit 70 converts an input signal received from the preceding-stage circuit into an output signal that has a higher voltage than the input signal. The high-side control circuit 120 receives the input from the level shift circuit 70 and outputs a control signal HO to the transistor 34. In the present example, the preceding-stage circuit is the low-side control circuit 130. The low-side control circuit 130 inputs the input signal into a set signal input terminal 12, a reset signal input terminal 14 and a state signal input terminal 16 of the level shift circuit 70.

The driving circuit 100 is configured to drive the transistor 34 and the transistor 74. The transistor 34 and the transistor 74 are connected in series and constitute an inverter circuit. When the driving circuit 100 inputs a control signal into the gates of the transistors 34 and 74, the transistors 34 and 74 are turned on/off. When the transistor 34 is turned on, the load 80 is connected to the high-potential side of the power source 82. When the transistor 74 is turned on, the load 80 is connected to the reference potential (the ground potential). Note that, in the present example, the transistors 34 and 74 are NMOS transistors.

The transistor 34 is positioned between the load 80 and the positive side of the power source 82.

The power source 82 is, for example, a power source configured to provide a voltage of 400 V. The driving circuit 100 complementarily turns on/off the transistors 34 and 74 to drive the load 80 with a voltage of ranging from 0 V to 400 V. Note that, for the purposes of simplified description, the voltage drop caused by the on resistance of the transistors and the forward voltage of the diodes are not mentioned herein. The voltage drop caused by the on resistance of the transistors and the forward voltage of the diodes may be considered to be sufficiently small when compared with the voltage value of the power source 82.

In the present example, Vs denotes the potential at the negative side of a power source 35 connected to the driving circuit 100. As the transistors 34 and 74 are turned on/off, the potential Vs may vary within the range of 0 V to 400 V. Here, Vb denotes the potential at the positive side of the power source 35 connected to the driving circuit 100. As used herein, the potential Vb may be referred to as the high-potential side of the driving circuit 100. When E1 denotes the power source voltage value of the power source 35, the potential Vb may vary within the range from E1 to (E1+400 V). For example, the voltage value E1 is 15 V.

The low-side control circuit 130 includes a low-side driver 72, a power source 76, a driving control circuit 131 and an abnormality detecting circuit 210.

A microcomputer 140 is provided outside or inside the driving circuit 100. In order to drive the low-side driver 72, the microcomputer 140 sends an input signal LIN to the driving control circuit 131. The driving control circuit 131 sends the input signal LIN to the low-side driver 72. The low-side driver 72 is driven by the input signal LIN from the microcomputer 140 to output a control signal LO, as a result of which the transistor 74, which is a switch element, is driven. The low-side driver 72 inputs the voltage at the high- or low-potential side of the power source 76 into the gate of the transistor 74 in order to turn on/off the transistor 74.

The low-side driver 72, the driving control circuit 131 and the abnormality detecting circuit 210 are each connected to the positive and negative sides of the power source 76.

The abnormality detecting circuit 210 detects an abnormal voltage at the power source 76 and other abnormalities and outputs a signal to the driving control circuit 131. The driving control circuit 131 receives an input signal HIN from the microcomputer 140 and generates a set signal (set) and a reset signal (reset). The set signal set is input into the set signal input terminal 12 and the reset signal reset is input into the reset signal input terminal 14. In addition, the driving control circuit 131 generates a state signal (LER) based on the signal received from the abnormality detecting circuit 210. The state signal LER is input into the state signal input terminal 16.

The driving circuit 100 includes a state signal input circuit 40, a set signal input circuit 50 and a reset signal input circuit 60. In the present example, the state signal input circuit 40, the set signal input circuit 50 and the reset signal input circuit 60 are collectively referred to as a level shift circuit 70. The state signal input circuit 40 includes a resistance element 42 connected to the high-potential side of the driving circuit 100 and a transistor 46 having a drain 47 connected to the low-potential side of the resistance element 42. Here, the low-potential side of the resistance element 42 indicates one of the two ends of the resistance element 42 that is not connected to the high-potential side of the driving circuit 100.

The set signal input circuit 50 also includes a resistance element 52 connected to the high-potential side of the driving circuit 100 and a transistor 56 having a drain 57 connected to the low-potential side of the resistance element 52. The reset signal input circuit 60 also includes a resistance element 62 connected to the high-potential side of the driving circuit 100 and a transistor 66 having a drain 67 connected to the low-potential side of the resistance element 62.

In the state signal input circuit 40, the set signal input circuit 50 and the reset signal input circuit 60, the high-potential sides of the resistance elements 42, 52 and 62 are connected to each other. In the present example, the resistance elements 42, 52 and 62 have the same resistance value, and the transistors 46, 56 and 66 have the same characteristics. Note that, in the present example, the transistors 46, 56 and 66 are NMOS transistors.

The preceding-stage circuit (the driving control circuit 131) inputs the state signal (LER) into the state signal input terminal 16, which is the gate terminal of the transistor 46. In this case, the state signal input circuit 40 shifts the level of the signal LER. The state signal input circuit 40 shifts the voltage value of the signal LER to a higher voltage value, as a result which a signal LERdrn is obtained. The signal LER indicates a predetermined logical value when the transistor 34 is to perform a soft shutdown to disconnect the high-potential side of the power source 82 and the load 80 from each other.

In the present example, the preceding-stage circuit inputs into the state signal input terminal 16 a signal LER having the HIGH level when an abnormality is detected. In addition, the preceding-stage circuit of the present example inputs into the state signal input terminal 16 a signal LER having the LOW level when no abnormality is detected. Accordingly, when the preceding-stage circuit detects an abnormality, the transistor 34 performs a soft shutdown.

When the transistor 46 is turned on by the signal LER having the HIGH level, the resistance element 42 experiences voltage drop. On the other hand, when the transistor 46 is turned off by the signal LER having the LOW level, the resistance element 42 experiences no voltage drop. For this reason, when the signal LER having the HIGH level is input, the potential at the drain 47 or the signal LERdrn may be lower than when the signal LER having the LOW level is input. To sum up, when the signal LER has the HIGH level, the potential at the drain 47 or the signal LERdrn takes the LOW level. On the other hand, when the signal LER has the LOW level, the potential at the drain 47 or the signal LERdrn takes the HIGH level.

The preceding-stage circuit inputs the set signal (set) into the set signal input terminal 12 of the transistor 56. In this case, the set signal input circuit 50 shifts the level of the set signal set. The set signal input circuit 50 shifts the voltage value of the set signal set to a higher voltage value, as a result which a signal setdrn is obtained.

The set signal set indicates a predetermined logical value when the transistor 34 is to be turned on to connect the high-potential side of the power source 82 to the load 80. In the present example, the preceding-stage circuit may output to the set signal input circuit 50 a set signal set having the HIGH level in order to turn on the transistor 34.

The preceding-stage circuit inputs the reset signal (reset) into the reset signal input terminal 14 of the transistor 66. In this case, the reset signal input circuit 60 shifts the level of the reset signal reset. The reset signal input circuit 60 shifts the voltage value of the reset signal reset to a higher voltage value, as a result of which a signal resdrn is obtained.

The reset signal reset indicates a predetermined logical value when the transistor 34 is to be turned off to disconnect the high-potential side of the power source 82 from the load 80. In the present example, the preceding-stage circuit may output to the reset signal input circuit 60 a reset signal reset having the LOW level in order to turn on the transistor 34. Note that, when the set signal set has the HIGH level and the reset signal reset has the LOW level, the transistor 34 is turned on.

The resistance elements 52 and 62 have the same capabilities as the resistance element 42. When the set signal set has the HIGH level, the potential at the drain 57 or the signal setdrn has the LOW level. On the other hand, when the set signal set has the LOW level, the potential at the drain 57 or the signal setdrn has the HIGH level. Likewise, when the reset signal reset has the HIGH level, the potential at the drain 67 or the signal resdrn has the LOW level. On the other hand, when the reset signal reset has the LOW level, the potential at the drain 67 or the signal resdrn has the HIGH level.

A source 49 of the transistor 46 is grounded. A parasitic capacitance 48 is formed between the drain 47 and the source 49. A source 59 of the transistor 56 and a source 69 of the transistor 66 are also grounded. A parasitic capacitance 58 is formed between the drain 57 and the source 59, and a parasitic capacitance 68 is formed between the drain 67 and the source 69. Since the transistors 46, 56, and 66 have the same characteristics in the present example, the parasitic capacitances 48, 58 and 68 have the same capacitance. As described above, the state signal input circuit 40, the set signal input circuit 50 and the reset signal input circuit 60 have the same characteristics.

Voltage surge means that voltage changes instantaneously. Because of the switching-on and -off of the transistor 34, voltage surge occurs and currents resultantly flow from the line having the potential Vs into the sources 49, 59 and 69 via the diodes 45, 55 and 65. The currents are expressed as the product of the temporal change (dv/dt) of the voltage caused by the voltage surge and the capacitance values (C) of the parasitic capacitances 48, 58 and 68. The currents may cause voltage drop in the resistance elements 42, 52 and 62.

As a result, the output signals from the drains 47, 57 and 67 or the signals LERdrn, resdrn and setdrn may exhibit the LOW level. Stated differently, the results may be the same as when signals LER, reset and set having the HIGH level are input into the transistors 46, 56 and 66. This is considered to be noise induced by the voltage surge. The noise may cause errors in the operation of the driving circuit 100.

In the present example, the state signal input circuit 40, the set signal input circuit 50 and the reset signal input circuit 60 have the same characteristics. Therefore, similar noise is included in the state signal input circuit 40, the set signal input circuit 50 and the reset signal input circuit 60. For this reason, when occurring in the level shift circuit 70, the noise can be judged by an anti-error circuit 90, which will be described later.

The state signal input circuit 40 includes a diode 44 that is connected to the high-potential side of the driving circuit 100 at the cathode thereof and connected to the low-potential side of the resistance element 42 at the anode thereof. The set signal input circuit 50 includes a diode 54 that is connected to the high-potential side of the driving circuit 100 at the cathode thereof and connected to the low-potential side of the resistance element 52 at the anode thereof. The reset signal input circuit 60 includes a diode 64 that is connected to the high-potential side of the driving circuit 100 at the cathode thereof and connected to the low-potential side of the resistance element 62 at the anode thereof. The potential at the anode of each of the diodes 44, 54 and 64 is clamped at the potential at the positive side of the power source 35 (i.e., the potential Vb).

The driving circuit 100 includes diodes 45, 55 and 65. The anodes of the diodes 45, 55 and 65 are connected to the negative side of the power source 35. The cathode of the diode 45 is connected to the drain 47 of the transistor 46. The cathode of the diode 55 is connected to the drain 57 of the transistor 56, and the cathode of the diode 65 is connected to the drain 67 of the transistor 66. The potential at the cathode of each of the diodes 45, 55 and 65 is clamped at the potential at the negative side of the power source 35 (i.e., the potential Vs).

Figure 2:
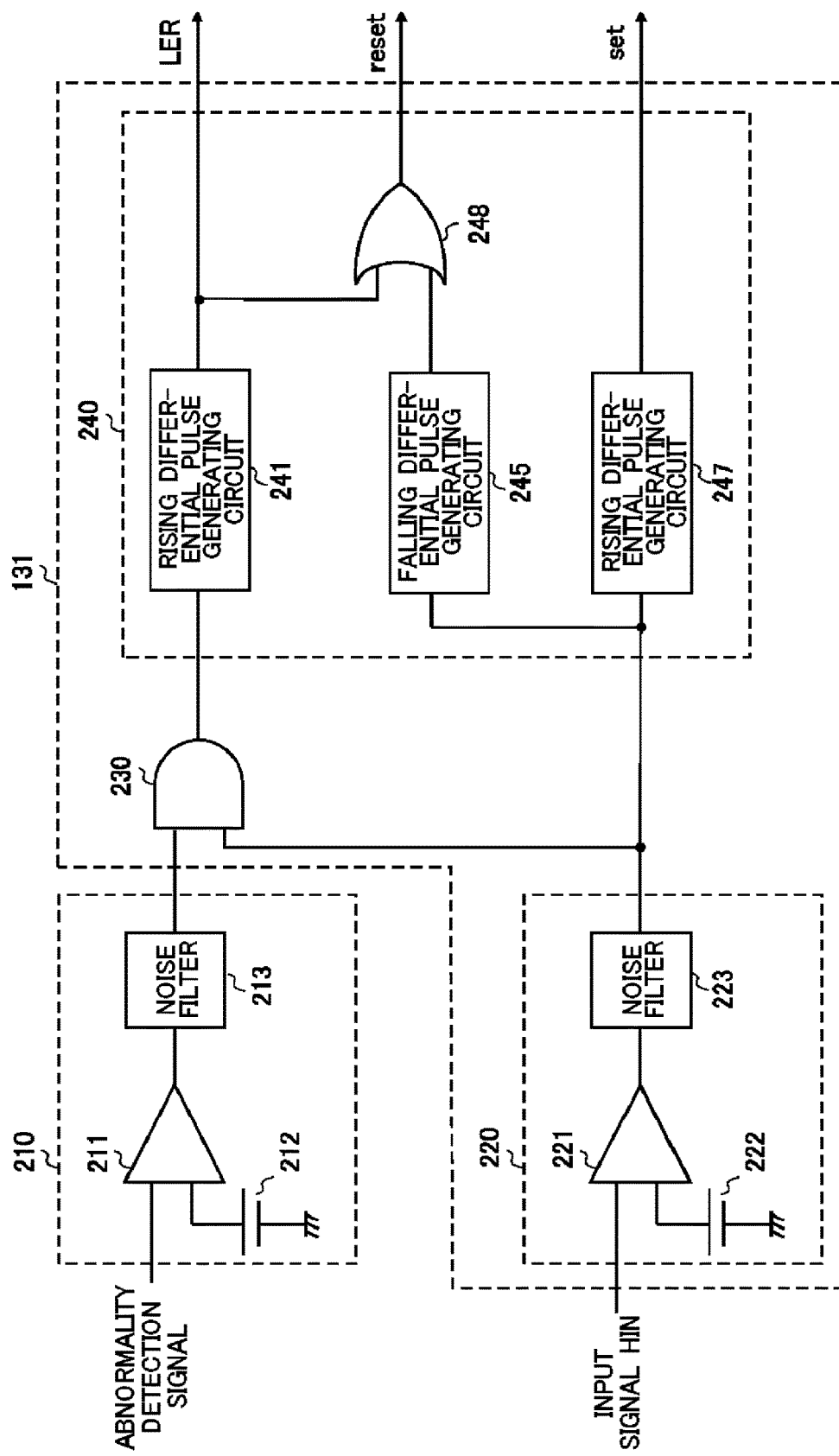
FIG. 2 shows part of a low-side control circuit 130.

FIG. 2 shows part of the low-side control circuit 130. A preceding-stage circuit 200 shown in FIG. 2 includes some of the constituents of the low-side control circuit 130 shown in FIG. 1 excluding the low-side driver 72, for example, the abnormality detecting circuit 210 and the driving control circuit 131. The preceding-stage circuit 200 shown in FIG. 2 may be provided outside the driving circuit 100, differently from the low-side control circuit 130 shown in FIG. 1. The preceding-stage circuit 200 inputs into the level shift circuit 70 the state signal LER, the reset signal reset and the set signal set. The preceding-stage circuit 200 includes an abnormality detecting circuit 210, an input buffer circuit 220, an AND logic circuit 230 and a pulse generating circuit 240.

The abnormality detecting circuit 210 includes a comparator 211, a reference power source 212, and a noise filter 213. The abnormality detecting circuit 210 receives an abnormality detection signal. The abnormality detection signal indicates whether abnormality occurs in the other portion of the preceding-stage circuit 200. In the present example, an abnormality detection signal having the HIGH level indicates abnormality is detected in the other portion of the preceding-stage circuit 200. On the other hand, an abnormality detection signal having the LOW level indicates that no abnormality is detected in the other portion of the preceding-stage circuit 200. Hereinafter, in the present example, the letters "H" and "L" respectively denote the HIGH and LOW logical values.

The comparator 211 compares the voltage value of the abnormality detection signal received at the non-inverting input terminal thereof against the reference voltage provided by the reference power source 212 received at the inverting input terminal thereof. The comparator 211 outputs the H signal to the noise filter 213 when the voltage value of the abnormality detection signal is higher than the reference voltage provided by the reference power source 212. The comparator 211 outputs the L signal to the noise filter 213 when the voltage value of the abnormality detection signal is lower than the reference voltage provided by the reference power source 212. The noise filter 213 removes the noise from the output signal from the comparator 211.

The input buffer circuit 220 has the same structure as the abnormality detecting circuit 210. In the input buffer circuit 220, however, the input signal HIN is input into the non-inverting input terminal of the comparator 221 in place of the abnormality detection signal. The comparator 221 outputs the H signal to the noise filter 223 when the voltage value of the input signal HIN is higher than the reference voltage provided by the reference power source 222. The comparator 221 outputs the L signal to the noise filter 223 when the voltage value of the input signal HIN is lower than the reference voltage provided by the reference power source 222.

The input signal HIN is a drive set signal designed to drive a high-side driver 32, which will be described later, in the driving circuit 100. In the present example, when the input signal HIN has the H level, the control signal HO for the high-side driver 32 in the driving circuit 100 has the H level. On the other hand, when the input signal HIN has the L level, the control signal HO for the high-side driver 32 in the driving circuit 100 has the L level.

The output signal from the abnormality detecting circuit 210 and the output signal from the input buffer circuit 220 are input into the AND logic circuit 230. When abnormality has been detected in the preceding-stage circuit 200 and the high-side driver 32 is to be driven, the abnormality detecting circuit 210 and the input buffer circuit 220 both output the H level to the AND logic circuit 230. Accordingly, in this case, the AND logic circuit 230 outputs the output signal having the H level to the pulse generating circuit 240. Therefore, the AND logic circuit 230 is configured to judge whether or not the transistor 34 is to perform a soft shutdown.

The pulse generating circuit 240 includes a rising differential pulse generating circuit 241, a falling differential pulse generating circuit 245 and a rising differential pulse generating circuit 247. The rising differential pulse generating circuits 241 and 247 are configured to generate a pulse signal at the rising timing of the input signal. Likewise, the falling differential pulse generating circuit 245 is configured to generate a pulse signal at the falling timing of the input signal.

The rising differential pulse generating circuit 241 receives the output signal from the AND logic circuit 230. At the timing at which the H level signal is received from the AND logic circuit 230, the rising differential pulse generating circuit 241 generates a pulse signal. The generated pulse signal is input into the state signal input terminal 16 of the level shift circuit 70 as the state signal LER. The signal LER is also input into the subsequent stage or an OR logic circuit 248 as the input signal thereinto.

The falling differential pulse generating circuit 245 receives the output signal from the input buffer circuit 220. The falling differential pulse generating circuit 245 detects the falling of the input signal HIN. Stated differently, the falling differential pulse generating circuit 245 generates a pulse signal at the falling timing of the input signal HIN. The generated pulse signal is input into the subsequent stage or the OR logic circuit 248.

The OR logic circuit 248 receives the state signal (LER) and the pulse signal output from the falling differential pulse generating circuit 245. As mentioned earlier, the signal LER is a pulse signal generated when abnormality has been detected in the preceding-stage circuit 200 and the high-side driver 32 is to be driven. The pulse signal output from the falling differential pulse generating circuit 245 is generated when the level of the input signal HIN transitions from the H level to the L level. In other words, the pulse signal output from the falling differential pulse generating circuit 245 is generated in order to stop the high-side driver 32.

The OR logic circuit 248 outputs the H level when abnormality is detected in the preceding-stage circuit 200, when abnormality has been detected in the preceding-stage circuit 200 and the high-side driver 32 is to be driven, or when the high-side driver 32 is to be stopped. The output signal from the OR logic circuit 248 is referred to as the reset signal (reset).

The rising differential pulse generating circuit 247 receives the output signal from the input buffer circuit 220. The rising differential pulse generating circuit 247 detects the rising of the input signal HIN. In other words, the rising differential pulse generating circuit 247 generates a pulse signal at the timing at which the high-side driver 32 starts to be driven. Thus, the output from the rising differential pulse generating circuit 247 is the set signal (set). The signals set, reset and LER are respectively input into the set signal input terminal 12, the reset signal input terminal 14 and the state signal input terminal 16 of the driving circuit 100.

Figure 3:
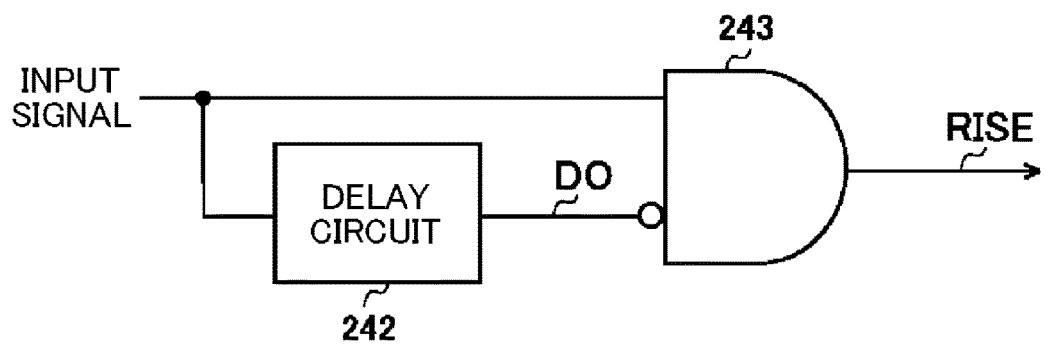
FIG. 3 shows exemplary rising differential pulse generating circuits 241 and 247.

FIG. 3 shows an example of the rising differential pulse generating circuit 241. The rising differential pulse generating circuit 241 is shown as an exemplary rising differential pulse generating circuit and may be configured using a different rising differential pulse generating circuit structure.

In the present example, the rising differential pulse generating circuit 241 has a delay circuit 242 and an AND logic circuit 243. The AND logic circuit 243 has two input terminals. The delay circuit 242 and one of the terminals of the AND logic circuit 243 receive the same input signal. The other one of the terminals of the AND logic circuit 243 receives the signal obtained by inverting the logic of the output signal DO from the delay circuit 242. The AND logic circuit 243 outputs as an output signal RISE the logical product between the input signal and the signal obtained by inverting the logic of the signal DO. Note that the output signal RISE from the rising differential pulse generating circuit 241 is referred to as the signal LER and the output signal RISE from the rising differential pulse generating circuit 247 is referred to as the signal set.

Figure 4:
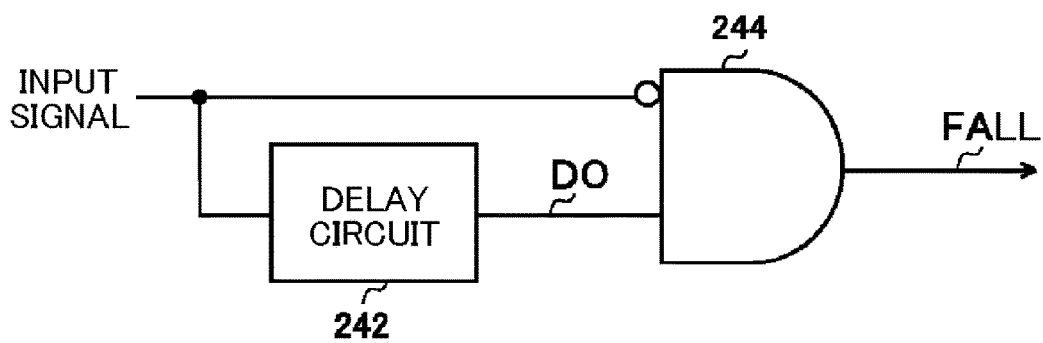
FIG. 4 shows an exemplary falling differential pulse generating circuit 245.

FIG. 4 shows an example of the falling differential pulse generating circuit 245. The falling differential pulse generating circuit 245 is shown as an exemplary falling differential pulse generating circuit and may be configured using a different falling differential pulse generating circuit structure.

In the present example, the falling differential pulse generating circuit 245 includes a delay circuit 242 and an AND logic circuit 244. The delay circuit 242 receives the input signal. The AND logic circuit 244 has two input terminals. One of the terminals of the AND logic circuit 244 receives the signal obtained by inverting the logic of the input signal. The other one of the terminals of the AND logic circuit 243 receives the output signal DO from the delay circuit 242. The AND logic circuit 244 outputs as an output signal FALL the logical product between the signal obtained by inverting the logic of the input signal and the output signal DO. The output signal FALL is referred to as the signal reset.

Figure 5:
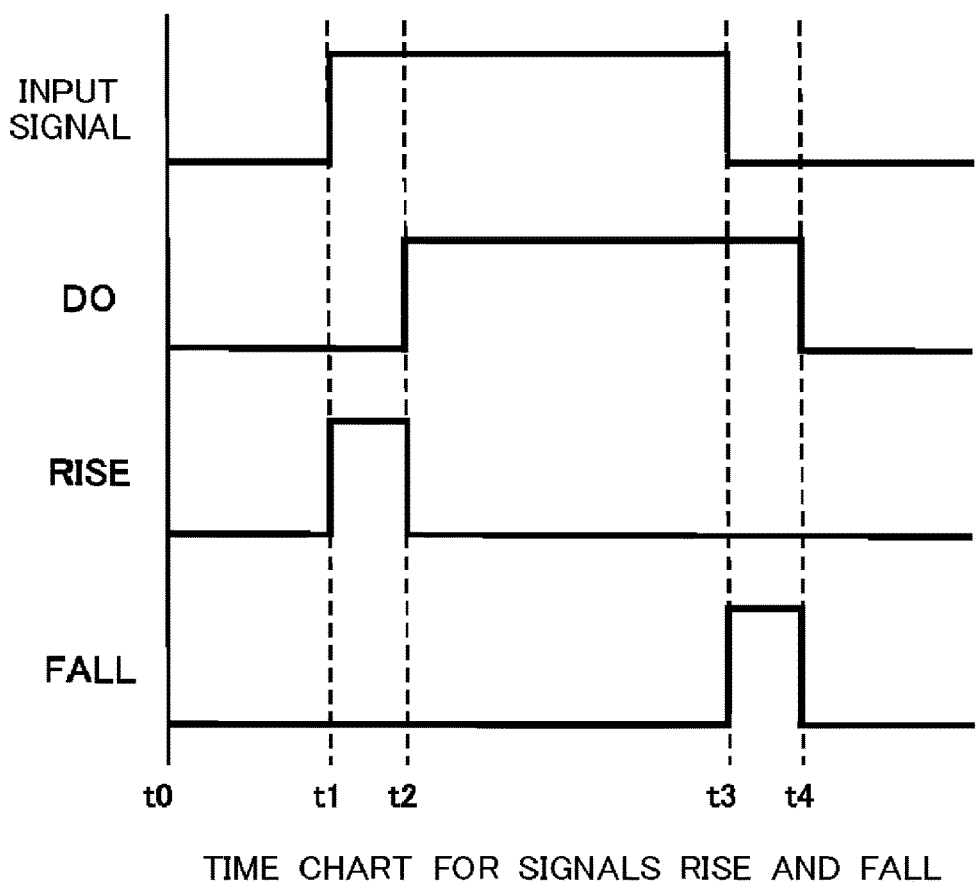
FIG. 5 is a time chart for signals RISE and FALL.

FIG. 5 is a time chart for the signals RISE and FALL. The vertical axis represents the voltage values of the input signal and the signals DO, RISE and FALL from the top. The horizontal axis represents the time. Along the horizontal axis, the time advances from left to right.

In the present example, all of the signals have a voltage value indicating the L level at the time t0. At the time t1, the input signal transitions from the L level to the H level. The delay circuits 242 transition from the L level to the H level at a later timing or at the time t2.

The AND logic circuits 243 generate an output signal that indicates the H level only during a period in which the input signal has the H level and the signal DO has the L level. In other words, the signals RISE are a pulse signal having the H level only during the period between the time t1 and the time t2. Here, the signal FALL remains at the L level between the time t1 and the time t2. At the time t3, the input signal transitions from the H level to the L level. The delay circuits 242 transition from the H level to the L level at a later timing or at the time t4.

The AND logic circuit 244 generates an output signal that indicates the H level only during the period in which the input signal has the L level and the signal DO has the H level. Accordingly, the signal FALL is a pulse signal that has the H level only during the period between the time t3 and the time t4. Note that the signals RISE remain at the L level during the period between the time t3 and the time t4.

Figure 6:
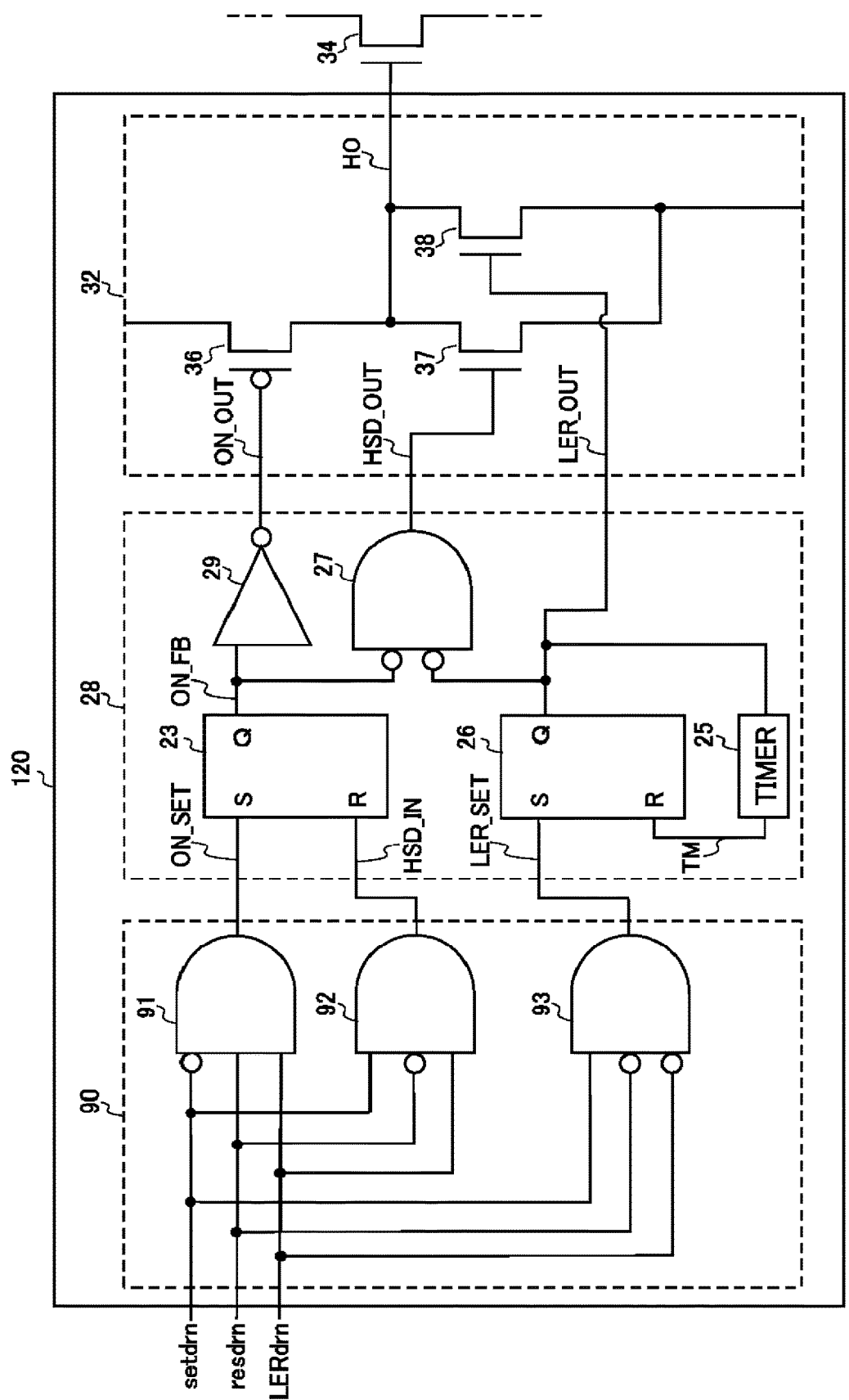
FIG. 6 specifically shows an exemplary high-side control circuit 120.

FIG. 6 specifically shows an exemplary high-side control circuit 120. The high-side control circuit 120 includes the anti-error circuit 90, a controller 28 and the high-side driver 32. The anti-error circuit 90, the controller 28 and the high-side driver 32 are each connected to the positive and negative sides of the power source 35 or to the output from the high-side internal power source circuit that is generated by the power source 35, which is not shown.

In the present example, the anti-error circuit 90 includes an AND logic circuit 91, an AND logic circuit 92 and an AND logic circuit 93. The AND logic circuits 91, 92 and 93 each receive the signals setdrn, resdrn and LERdrn that are obtained by shifting the levels of the signals set, reset and LER input from the preceding-stage circuit to the level shift circuit 70.

In the present example, the AND logic circuit 91 outputs the logical product between the inverted voltage value of the signal setdrn, the voltage value of the signal resdrn and the voltage value of the LERdrn to the RS latch circuit 23 as a signal ON_SET.

In the present example, the AND logic circuit 92 outputs the logical product between the voltage value of the signal setdrn, the voltage value of the signal LERdrn and the inverted voltage value of the signal resdrn to the RS latch circuit 23 as a signal HSD_IN.

In the present example, the AND logic circuit 93 outputs the logical product between the voltage value of the signal setdrn, the inverted voltage value of the signal resdrn, and the inverted voltage value of the signal LERdrn to the RS latch circuit 26 as a signal LER_SET.

The controller 28 outputs a signal ON_OUT, a signal HSD_OUT and a signal LER_OUT to the high-side driver 32 based on the three input signals. The high-side driver 32 receives the signals ON_OUT, LER_OUT and HSD_OUT and outputs the control signal HO to the transistor 34. The transistor 34 is switched on/off according to the input control signal, which is the signal HO. In the present example, the transistor 34 is switched on when the control signal HO has the HIGH level.

The following describes in detail how the controller 28 and the high-side driver 32 operate. In the present example, the controller 28 includes an RS latch circuit 23, a timer circuit 25, an RS latch circuit 26, an AND logic circuit 27 and an inverter circuit 29. In the present example, the high-side driver 32 includes a p-channel MOSFET 36, an n-channel MOSFET 37 and an n-channel MOSFET 38. The n-channel MOSFET 37 has a lower on resistance than the n-channel MOSFET 38.

The RS latch circuits 23 and 26 have the same capabilities as common RS latch circuits. To be specific, the RS latch circuit 23 instructs transition to a different state in the case of (ON_SET, HSD_IN)=(1, 0) and (0, 1). In addition, the RS latch circuit 23 maintains the previous value of the output signal (ON_FB) in the case of (ON_SET, HSD_IN)=(0, 0). The RS latch circuit 26 instructs transition to a different state in the case of (LER_SET, TM)=(1, 0) and (0, 1). The RS latch circuit 26 maintains the previous value of the output signal (LER_OUT) in the case of (LER_SET, TM)=(0, 0).

The RS latch circuit 23 outputs the output signal ON_FB to the inverter circuit 29 and the AND logic circuit 27 according to the output signals ON_SET and HSD_IN. The RS latch circuit 26 outputs the signal LER_OUT, which is the control signal for the AND logic circuit 27 and the n-channel MOSFET 38, according to the signal LER_SET and the output signal TM from the timer. The inverter circuit 29 outputs a signal ON_OUT, which is the control signal for the p-channel MOSFET 36.

The AND logic circuit 27 outputs a signal HSD_OUT, which is the control signal for the n-channel MOSFET 37. The AND logic circuit 27 receives the signals ON_FB and LER_OUT. In the present example, the AND logic circuit 27 outputs the logical product between the inverted voltage value of the signal ON_FB and the inverted voltage value of the signal LER_OUT to the gate of the n-channel MOSFET 37 as the signal HSD_OUT. Note that the signals ON_SET, HSD_IN, LER_SET, ON_OUT and HSD_OUT, and LER_OUT exhibit a voltage value indicating the HIGH or LOW level.

In the present example, "1" expresses the HIGH logical value and "0" expresses the LOW logical value. Note that, in other examples, "H" and "L" may be used to express the HIGH and LOW logical values. When the signal setdrn=0, the signal set=1. On the other hand, when the signal setdrn=0, the signal set=0. This relation also applies to the signals resdrn and reset and to the signals LERdrn and LER.

(Drive Set)

The signal ON_FB indicates "1" only in the case of (ON_SET, HSD_IN, LER_SET)=(1, 0, 0). When the signal ON_FB indicates "1," the output ON_OUT from the inverter circuit 29 indicates "0," which turns on the p-channel MOSFET 36, and the output HSD_OUT from the AND logic circuit 27 also indicates "0," which turns off the n-channel MOSFET 37. Since the signal LER_OUT also indicates "0," the n-channel MOSFET 38 is also turned off. As a result, the signal HO indicates "1" and the transistor 34 is turned on.

(Hard Shutdown: Lh)

The signal HSD_OUT indicates "1" only in the case of (ON_SET, HSD_IN, LER_SET)=(0, 1, 0). In this case, the signal ON_OUT indicates "1," which turns off the p-channel MOSFET 36, the signal HSD_OUT indicates "1," which turns on the n-channel MOSFET 37, and the signal LER-OUT indicates "0," which turns off the n-channel MOSFET 38. Accordingly, the signal HO indicates "0," in which case the transistor 34 performs a hard shutdown.

(Soft Shutdown: Ls)

In the present example, the signal LER_SET indicates "1" only in the case of "the output from the abnormality detecting circuit 210, the set signal for the input signal HIN)=(1, 1). The signal LER_SET indicates "0" in other cases. When the signal LER_SET indicates "1," the signal LER_OUT indicates "1." In the present example, only in the case of the signal LER_OUT=1, the signal HO for the high-side driver 32 is controlled in order to allow the transistor 34 to perform a soft shutdown.

When the signal LER_SET indicates "1," (ON_SET, HSD_IN, LER_SET)=(0, 0, 1) and the signal ON_FB indicates "0." When the signal LER_OUT indicates "1" and the signal ON_FB indicates "0," the signal ON_OUT indicates "1," which turns off the p-channel MOSFET 36, and the signal HSD_OUT indicates "0," which keeps the n-channel MOSFET 37 turned off. In addition, since the signal LER_OUT indicates "1," the n-channel MOSFET 38 is turned on.

The timer circuit 25 outputs an output signal TM indicating "1" when a predetermined period of time has elapsed after the signal LER_OUT transitions from "0" to "1." In other cases, the output signal TM from the timer circuit 25 indicates "0." This stays the same until the output signal TM from the timer circuit 25 transitions to "1." Once the output signal TM from the timer circuit 25 transitions to "1," the signal LER_OUT indicates "0" and the signal HSD_OUT indicates "1," which turns on the n-channel MOSFET 37 and turns off the n-channel MOSFET 38. As a result, there is a transition from the soft shutdown Ls to the hard shutdown Lh.

The above-described controls according to the present example are summarized in Table 1 below. Note that the "INSTRUCTIONS MADE BY INPUT SIGNALS" field for Lh states "DRIVE SOFT SHUTDOWN RESET," which means that a hard shutdown takes place after a soft shutdown.

TABLE 1

| INPUT SIGNALS INTO ANTI-ERROR CIRCUIT 90 | | | OUTPUT FROM DRIVER 32 | INSTRUCTIONS MADE BY INPUT SIGNALS |
|---|---|---|---|---|
| setdrn | resdrn | LERdrn | HO | (setdrn, resdrn, LERdrn) |
| 0 | 0 | 0 | MAINTAIN | ERROR (NOISE etc.) |
| 0 | 0 | 1 | MAINTAIN | ERROR (NOISE etc.) |
| 0 | 1 | 0 | MAINTAIN | ERROR (NOISE etc.) |
| 0 | 1 | 1 | High | DRIVE SET |
| 1 | 0 | 0 | Ls (SOFT SHUTDOWN) | DRIVE SOFT SHUTDOWN SET |
| 1 | 0 | 1 | Lh (HARD SHUTDOWN) | DRIVE RESET OR DRIVE SOFT SHUTDOWN RESET |
| 1 | 1 | 0 | MAINTAIN | ERROR (NOISE etc.) |
| 1 | 1 | 1 | MAINTAIN | STANDBY |

Figure 7:
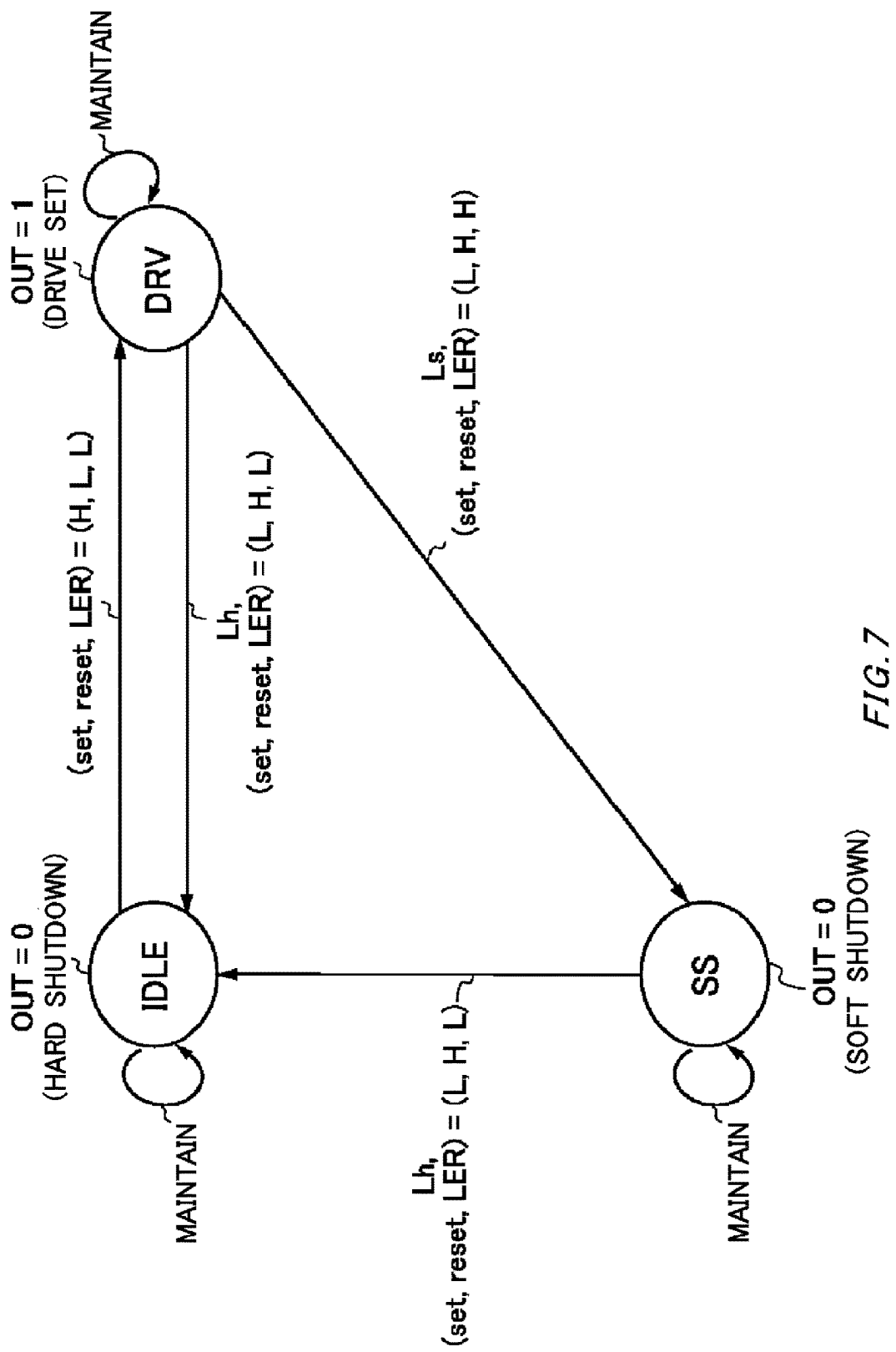
FIG. 7 shows the transition between the states of a controller 28.

FIG. 7 shows the state transitions of the controller 28. The IDLE state means that the output OUT from the controller 28 exhibits the LOW level as a result of a drive reset instruction or a drive soft shutdown reset instruction. In the present example, the LOW level of the signal OUT is expressed as OUT=0. The DRV state means that the signal OUT exhibits the HIGH level as a result of a drive set instruction. In the present example, the HIGH level of the signal OUT is expressed as OUT=1. The SS state means that the signal OUT exhibits the LOW level as a result of a drive soft shutdown set instruction.

There are two paths to reach the IDLE state. According to one of the paths, the controller 28 enters the IDLE state by performing a hard shutdown while the controller 28 is in the DRV state. This path is equivalent to the "DRIVE RESET" instruction, which is shown in one of the fields under "INSTRUCTIONS MADE BY INPUT SIGNALS" in Table 1. In the present example, "H" and "L" respectively express the HIGH- and LOW-level logical values of the input signals set, reset and LER. When the input signals are (set, reset, LER)=(L, H, L), the controller 28 transitions from the DRV state to the IDLE state.

According to the other one of the paths, the controller 28 enters the IDLE state by performing a hard shutdown while the controller 28 is in the SS state. This path is equivalent to the "DRIVE SOFT SHUTDOWN RESET" instruction, which is shown in one of the fields under "INSTRUCTIONS MADE BY INPUT SIGNALS" in Table 1. When the input signals are (set, reset, LER)=(L, H, L), the controller 28 transitions from the SS state to the IDLE state.

While in the IDLE state, the controller 28 transitions from the IDLE state to the DRV state if the input signals are (set, reset, LER)=(H, L, L). While in the DRV state, the controller 28 transitions from the DRV state to the SS state if the input signals are (set, reset, LER)=(L, H, H). Note that, when the input signals exhibit the other combinations of the logical values, the controller 28 controls the high-side driver 32 in such a manner that the current outputs are maintained.

Figure 8:
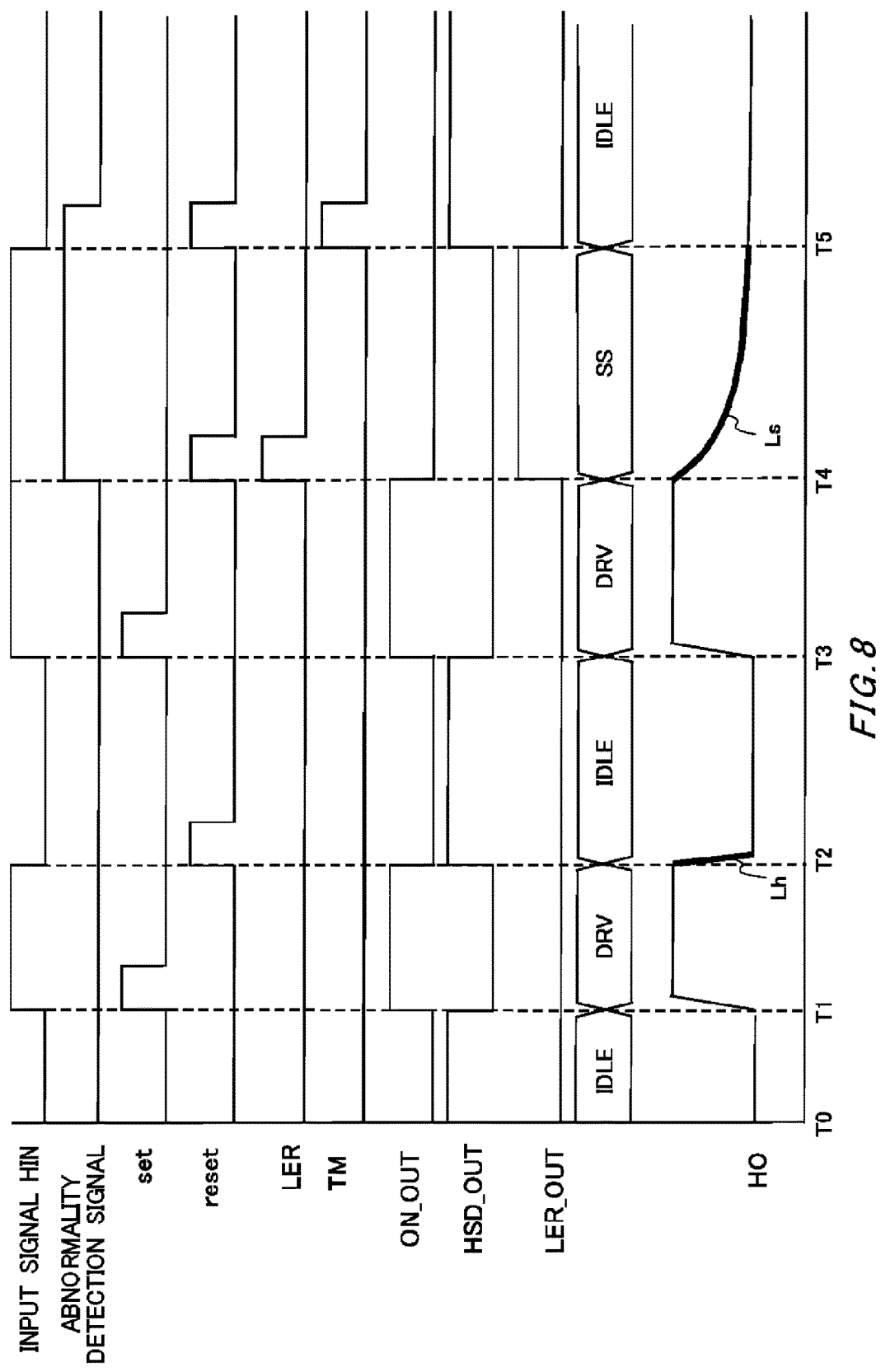
FIG. 8 shows a first example of how the driving circuit 100 operates.

FIG. 8 shows a first example of how the driving circuit 100 operates. The vertical axis shows, from the top, the voltage values of the input signal HIN, the abnormality detection signal, the signal set, the signal reset, the signal LER, the signal TM, the signal ON_OUT, the signal HSD_OUT and the signal LER_OUT, and the voltage value of the control signal HO from the high-side driver 32. The horizontal axis represents the time. Along the horizontal axis, the time advances from left to right. In the present example, "H" and "L" respectively express the HIGH- and LOW-level logical values for the signals set, reset, LER, TM, ON_OUT, HSD_OUT, LER_OUT and HO.

At the time T0, the high-side control circuit 120 is in the IDLE state. At the time T1, the signals (set, reset, LER)=(H, L, L) are input. As a result, the high-side control circuit 120 enters the DRV state. In addition, the control signal HO from the high-side driver 32 exhibits the H level.

The pulse signal of the signal set at the time T1 is generated by the input signal HIN that rises at a timing earlier than the time T1. The pulse signal of the signal set at the time T3 is generated by the input signal HIN that rises at a timing earlier than the time T3. Note that, for the intelligibility of the drawings, the input signal HIN and the signal set are shown as rising at substantially the same timing in FIG. 8.

At the time T2, the signals (set, reset, LER)=(L, H, L) are input. As a result, the high-side control circuit 120 enters the IDLE state. In other words, the control signal HO from the high-side driver 32 performs a hard shutdown. As a result, the control signal HO from the high-side driver 32 exhibits the L level.

The pulse signal of the signal reset at the time T2 is generated by the input signal HIN that falls at a timing earlier than the time T2. The pulse signal of the signal reset at the time T5 is generated by the input signal HIN that falls at a timing earlier than the time T5. Note that, for the intelligibility of the drawings, the input signal HIN is shown as falling at substantially the same timing as the rising timing of the signal reset in FIG. 8.

At the time T3, the signals (set, reset, LER)=(H, L, L) are input. As a result, the high-side control circuit 120 enters the DRV state. In other words, the control signal HO from the high-side driver 32 performs a drive set. As a result, the control signal HO from the high-side driver 32 exhibits the H level.

At the time T4, the signals (set, reset, LER)=(L, H, H) are input. As a result, the high-side control circuit 120 enters the SS state. In other words, the control signal HO from the high-side driver 32 performs a soft shutdown. As a result, the control signal HO from the high-side driver 32 exhibits the L level after a longer period of time elapses than when performing a hard shutdown.

The pulse signal of the signal reset at the time T4 is generated by the abnormality detection signal that rises at a timing earlier than the time T4.

In addition, the pulse signal of the signal LER at the time T4 is generated by the abnormality detection signal that rises at a timing earlier than the time T4 and the input signal that exhibits the H level at the time T4. Note that, for the intelligibility of the drawings, the abnormality detection signal and the signal LER are shown as rising at substantially the same timing in FIG. 8.

At the time T5, the signal TM=H is input. As a result, the high-side control circuit 120 enters the IDLE state. In other words, the control signal HO from the high-side driver 32 performs a hard shutdown. As a result, the control signal HO from the high-side driver 32 transitions to the L level. In the present example, however, the control signal HO has already transitioned to the L level by the time T5. Therefore, the logical value of the control signal HO does not change at the time T5.

Figure 9:
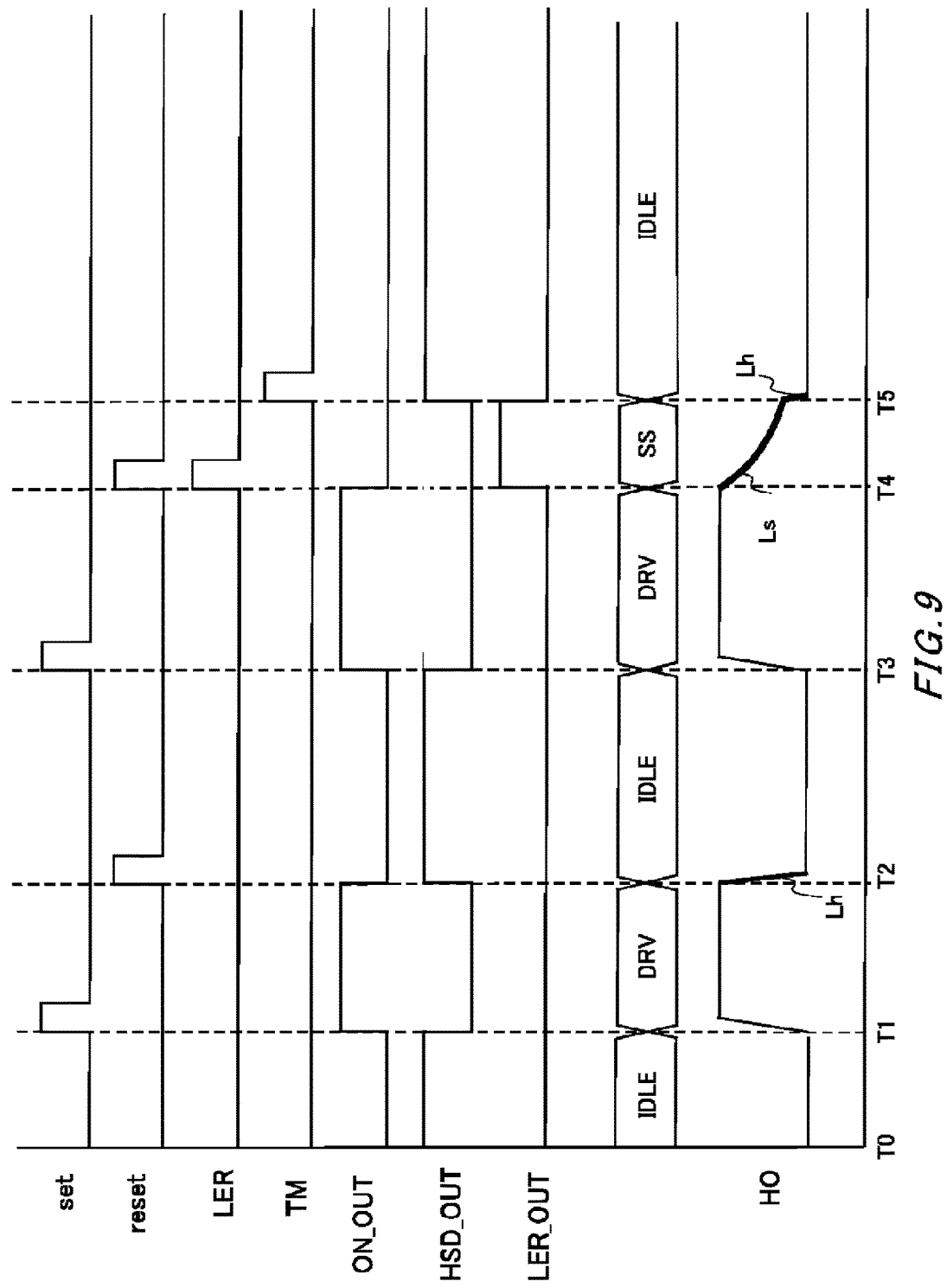
FIG. 9 shows a second example of how the driving circuit 100 operates.

FIG. 9 shows a second example of how the driving circuit 100 operates. In the high-side control circuit 120, the timer signal TM=H is input from the timer circuit 25 when a predetermined period of time has elapsed after the soft shutdown for the transistor 34 starts, and a hard shutdown starts for the transistor 34. In this regard, the present example is different from the example shown in FIG. 8. Except for this, the present example is the same as the example shown in FIG. 8. As used herein, "a SS state period" for the controller 28 means the predetermined period of time from the start of the soft shutdown for the transistor 34 to the start of the hard shutdown of the transistor 34. In the present example, the SS state period, or the period of time between the time T4 and the time T5 is several microseconds to several dozen microseconds.

The controller 28 may determine the length of the SS state period depending on the type of the abnormality detected in the preceding-stage circuit. Here, the abnormality detected in the preceding-stage circuit may be one or more of abnormal voltage (for example, voltage drop) at the power source 76 in the preceding-stage circuit, overcurrent or overheating of the transistor 74, which serves as the second switch element, and the like. The controller 28 may determine the length of the SS state period collectively taking these abnormalities that may occur in the preceding-stage circuit into consideration.

The controller 28 may determine the time constant for the soft shutdown depending on the type of the abnormality detected in the preceding-stage circuit. The time constant may be determined as appropriate depending on the application that is selected from an industrial motor, an air conditioner, an automobile motor and the like. The operating voltage may vary depending on the operating voltage of the application. For example, the time constant may be reduced if a faster shutdown is desired without causing voltage surge.

The high-side control circuit 120 may include a signal judging unit configured to judge the type of the abnormality in the preceding-stage circuit. The signal judging unit may, for example, count the number of pulses of the signal LER during the period from when a pulse signal of the signal reset is input to when the next pulse signal of the signal reset is input. The signal judging unit may count the pulse width of the signal LER. The signal judging unit may judge the type of the abnormality based on the counted number of pulses of the signal LER. The signal judging unit may notify the type of the abnormality determined by the number of pulses of the controller 28. In this manner, the controller 28 can determine the time constant for the soft shutdown depending on the type of the abnormality detected in the preceding-stage circuit.

Figure 10:
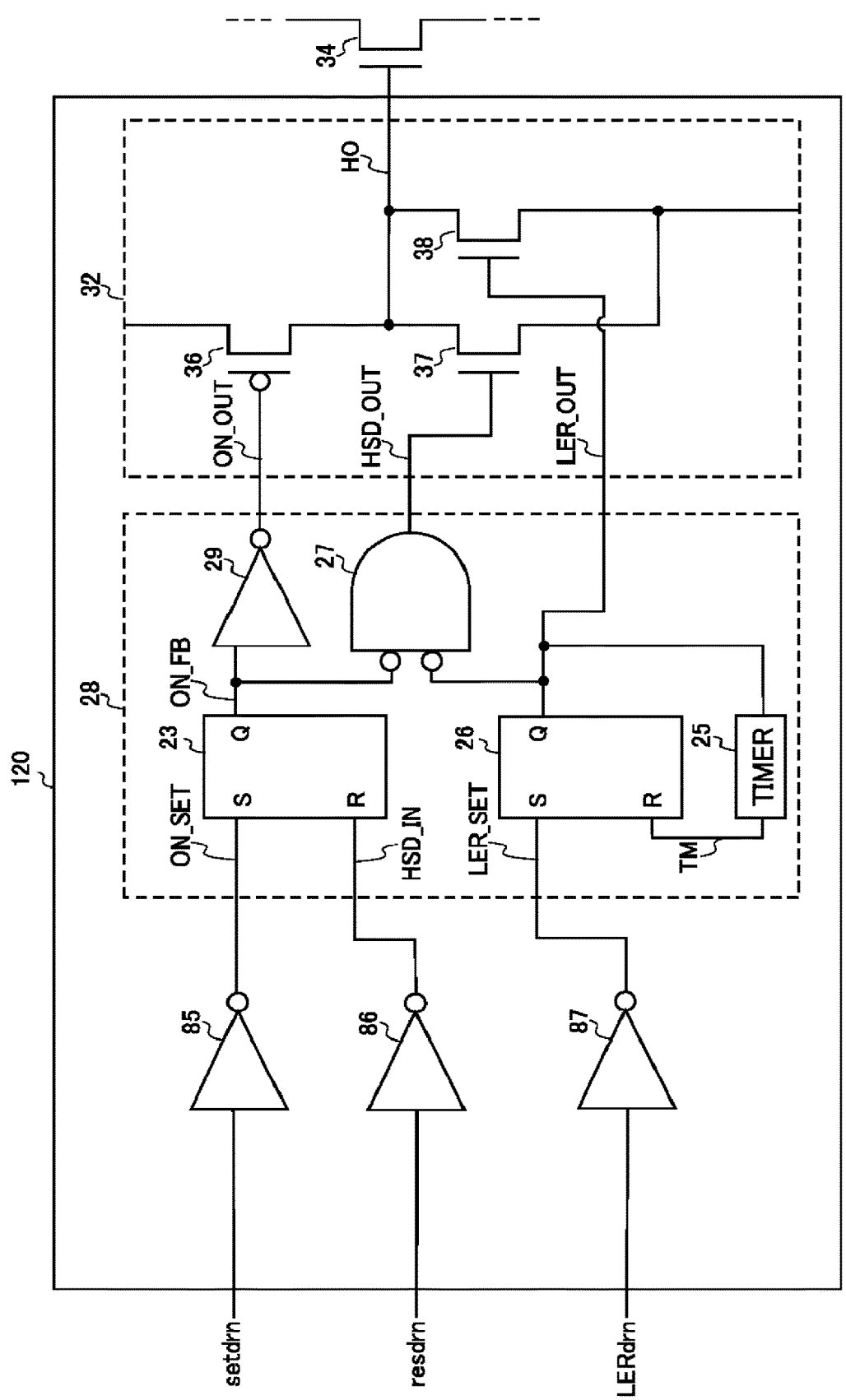
FIG. 10 shows a high-side control circuit 120.

FIG. 10 shows a first modification example of the high-side control circuit 120. If it is not necessary to consider the above-described noise caused by the voltage surge and other problems, the anti-error circuit 90 shown in FIG. 6 may not be necessary. FIG. 10 shows an inverter circuit 85, an inverter circuit 86 and an inverter circuit 87, in place of the anti-error circuit 90 shown in FIG. 6. Except for this, the present modification example is the same as the example shown in FIG. 6.

The inverter circuit 85 receives the signal setdrn, which indicates the potential at the drain 57, and outputs the inverted signal ON_SET to the RS latch circuit 23. The inverter circuit 86 receives the signal resdrn, which indicates the potential at the drain 67, and outputs the inverted signal HSD_IN to the RS latch circuit 23. The inverter circuit 87 receives the signal LERdrn, which indicates the potential at the drain 47, and outputs the inverted signal LER_SET to the RS latch circuit 26. The high-side control circuit 120 having the configuration shown in FIG. 10 operates in the same manner as described with reference to FIGS. 8 and 9, which show how the high-side control circuit 120 having the configuration shown in FIG. 6 operates.

Figure 11:
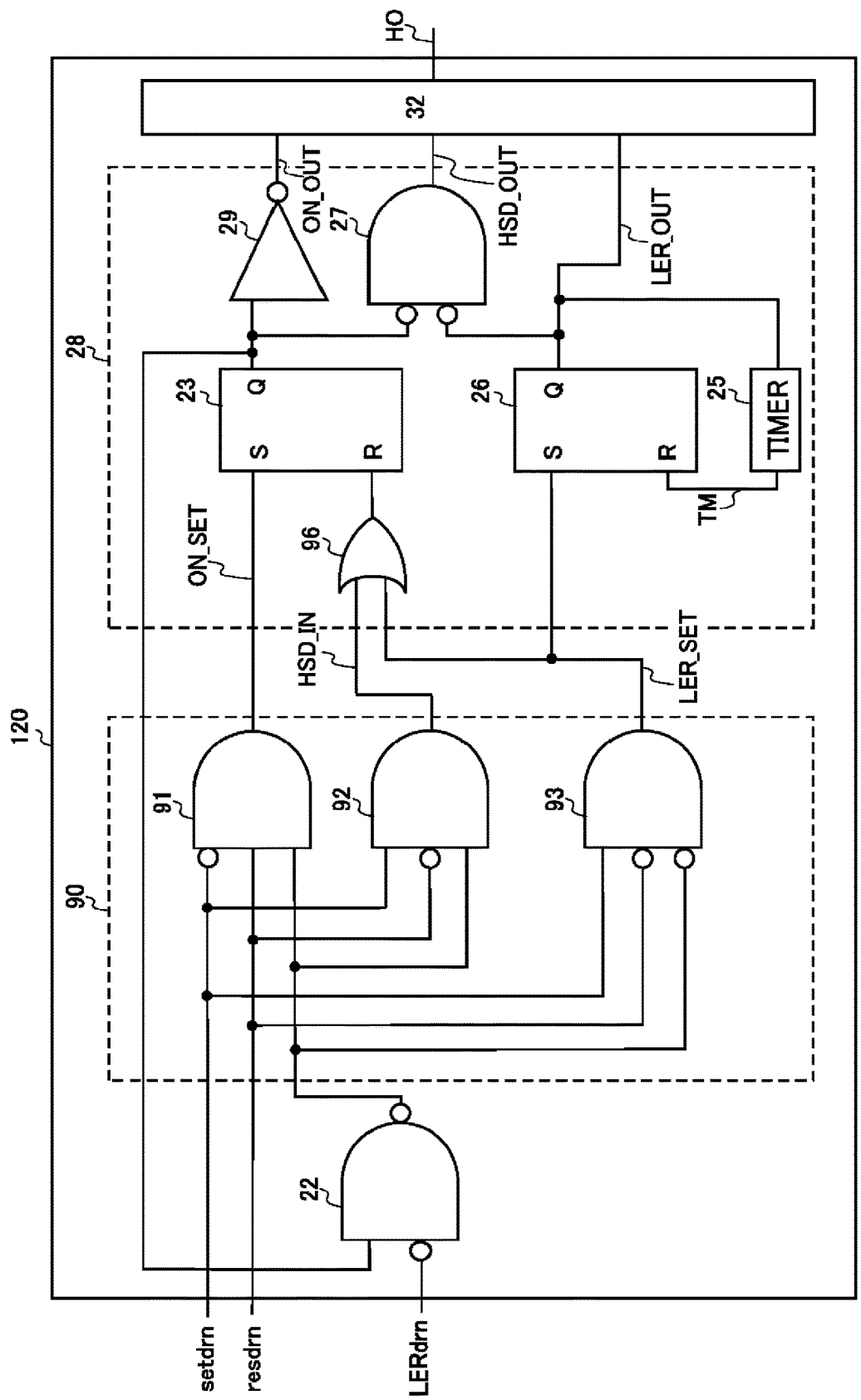
FIG. 11 shows the high-side control circuit 120.

FIG. 11 shows a second modification example of the high-side control circuit 120. The high-side control circuit 120 shown in FIG. 11 is different from the high-side control circuit 120 shown in FIG. 6 in that an AND logic circuit 22 and an OR logic circuit 96 are included. When the configuration shown in FIG. 11 is employed, the preceding-stage circuit 200 shown in FIG. 2 does not require the AND logic circuit 230 and the OR logic circuit 248. The output from the noise filter 213, which is shown in FIG. 2, is directly input into the rising differential pulse generating circuit 241. In addition, the output from the falling differential pulse generating circuit 245 is treated as the signal reset.

The AND logic circuit 22 shown in FIG. 11 receives the signal LERdrn and the output signal ON_FB from the RS latch circuit 23. In the present example, the AND logic circuit 22 outputs the logical product between the inverted voltage value of the signal LERdrn and the voltage value of the output signal ON_FB from the RS latch circuit 23 to the anti-error circuit 90 as the signal LER_SET. The signal LER_SET is also output to the OR logic circuit 96. The AND logic circuit 22 is a circuit configured to judge whether the transistor 34 is to perform a soft shutdown. The high-side control circuit 120 shown in FIG. 11 also operates in the manner described with reference to FIGS. 8 and 9.

Figure 12:
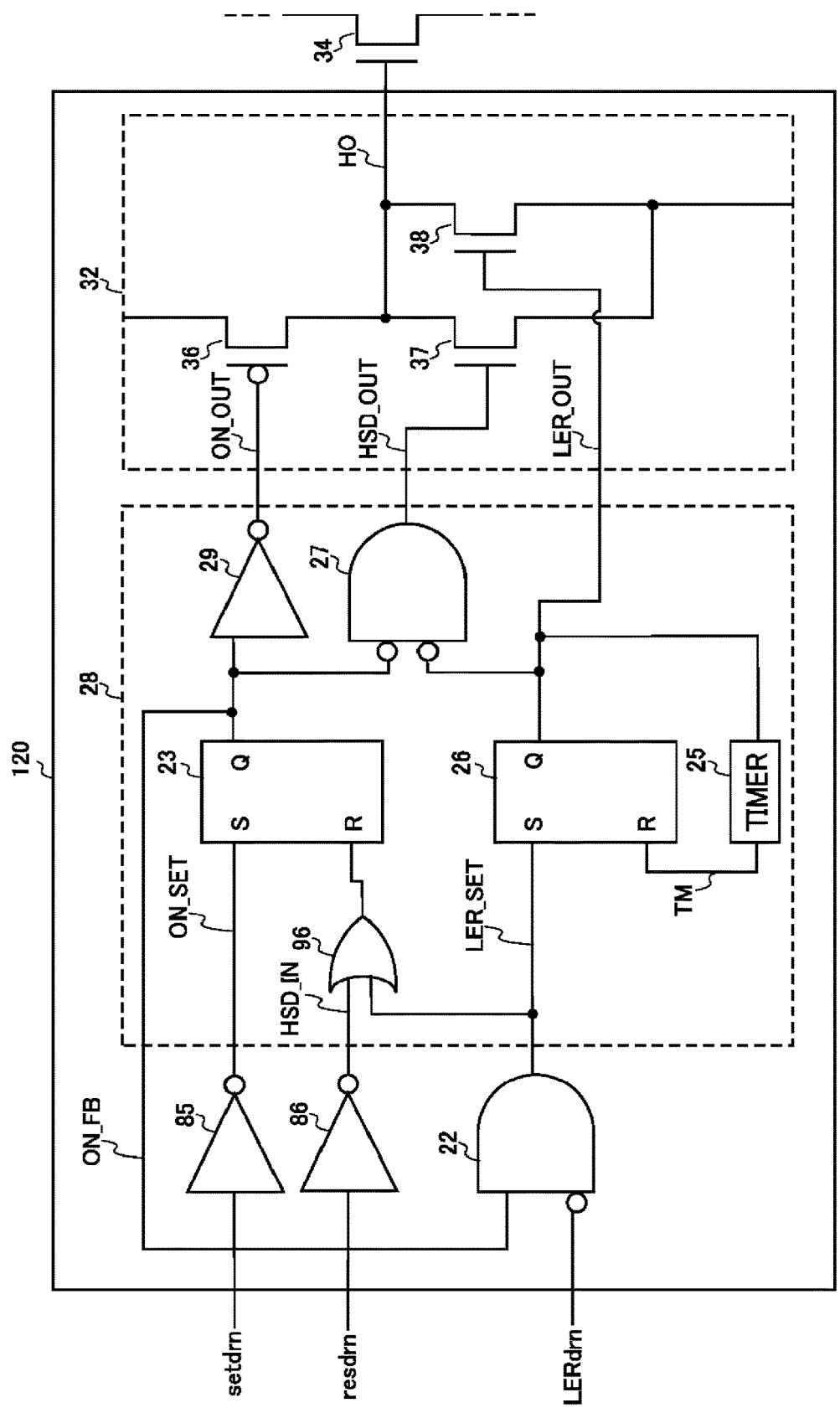
FIG. 12 shows the high-side control circuit 120.

FIG. 12 shows a third modification example of the high-side control circuit 120. In this example, the noise caused by the voltage surge and other problems need not be considered as in the high-side control circuit 120 shown in FIG. 10 and the anti-error circuit 90 is not incorporated. In addition, the high-side control circuit 120 shown in FIG. 12 includes the AND logic circuit 22 and the OR logic circuit 96, like the high-side control circuit 120 shown in FIG. 11. When the high-side control circuit 120 has the configuration shown in FIG. 12, the preceding-stage circuit 200 shown in FIG. 2 does not require the AND logic circuit 230 and the OR logic circuit 248. The high-side control circuit 120 having the configuration shown in FIG. 12 operates in the same manner as described with reference to FIGS. 8 and 9.

Figure 13:
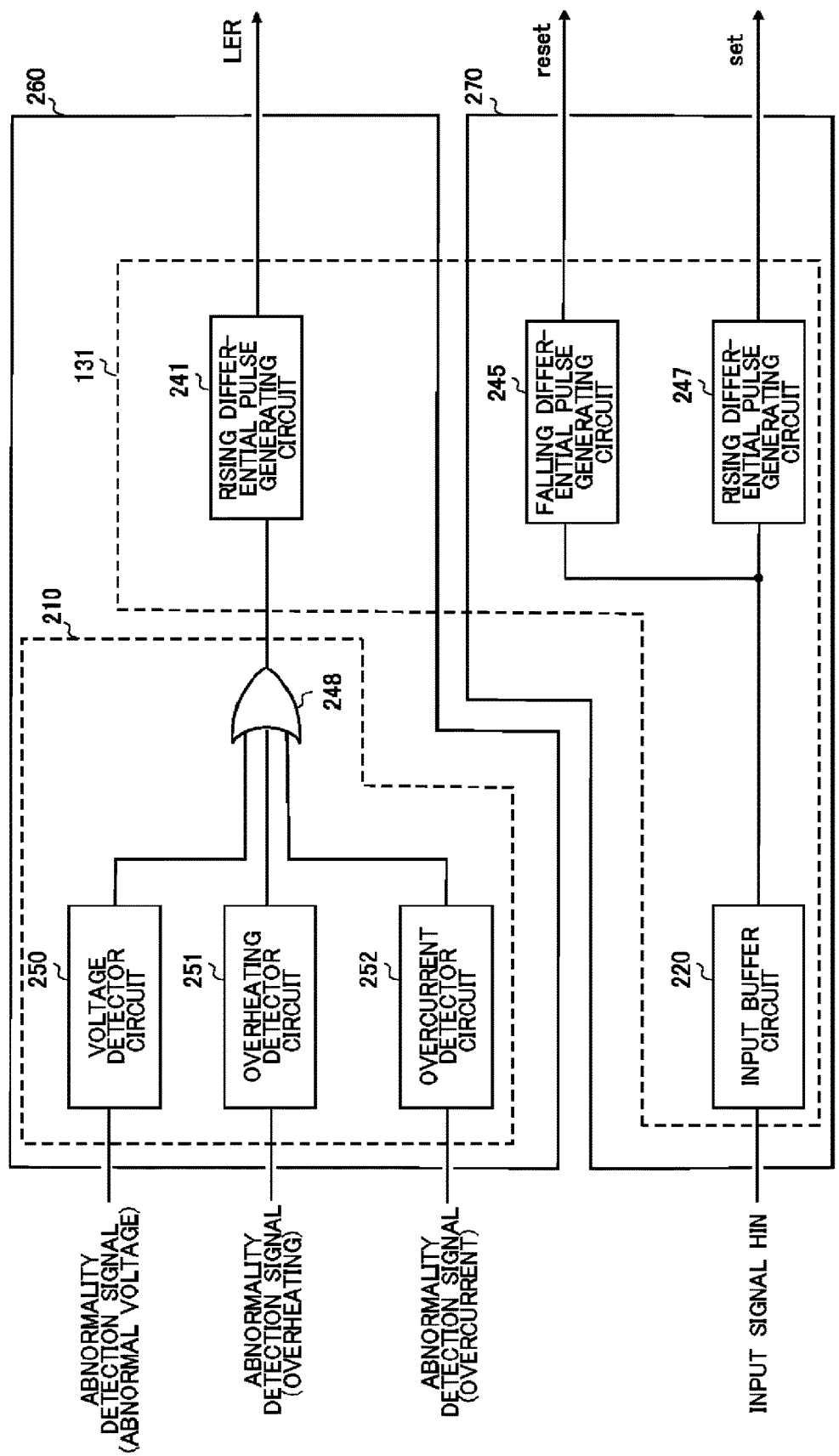
FIG. 13 shows a first modification example of a preceding-stage circuit 200.

FIG. 13 shows a first modification example of the preceding-stage circuit 200, or a preceding-stage circuit 202. In the present example, the preceding-stage circuit 202 includes a first semiconductor chip 260 and a second semiconductor chip 270. The first semiconductor chip 260 includes the abnormality detecting circuit 210 and the rising differential pulse generating circuit 241 that forms part of the driving control circuit 131. The abnormality detecting circuit 210 includes a voltage detector circuit 250, an overheating detector circuit 251, an overcurrent detector circuit 252 and an OR logic circuit 248.

The voltage detector circuit 250 receives an abnormality detection signal indicating abnormal voltage in the other portion of the preceding-stage circuit 202. The overheating detector circuit 251 receives an abnormality detection signal indicating the transistor 74 shown in FIG. 1 is overheated. The overcurrent detector circuit 252 receives an abnormality detection signal indicating overcurrent flowing through the transistor 74 shown in FIG. 1.

The voltage detector circuit 250, the overheating detector circuit 251 and the overcurrent detector circuit 252 have the same structure as the abnormality detecting circuit 210 shown in FIG. 2. The voltage detector circuit 250, the overheating detector circuit 251 and the overcurrent detector circuit 252 respectively input into the OR logic circuit 248 the signal having the H level when respectively detecting abnormal voltage, overheating and overcurrent. In the present example, the letters "H" and "L" also respectively express the HIGH- and LOW-level logical values.

The OR logic circuit 248 outputs the signal indicating the H level to the rising differential pulse generating circuit 241 when one of the signals output from the voltage detector circuit 250, the overheating detector circuit 251 and the overcurrent detector circuit 252 indicates the H level. Based on this, the rising differential pulse generating circuit 241 outputs the signal indicating the H level or abnormality to the state signal input terminal 16, as the signal LER.

The second semiconductor chip 270 includes the input buffer circuit 220, the falling differential pulse generating circuit 245 and the rising differential pulse generating circuit 247. These circuits have the same capabilities as described with reference to FIG. 2. The input buffer circuit 220 receives the input signal HIN from the other portion of the preceding-stage circuit 202. The falling differential pulse generating circuit 245 inputs the signal reset into the reset signal input terminal 14, and the rising differential pulse generating circuit 247 inputs the signal set into the set signal input terminal 12.

In the present example, the low-side driver 72 of the driving circuit 100 may be incorporated into one of the first semiconductor chip 260 and the second semiconductor chip 270. Alternatively, the low-side driver 72 may be incorporated into a third semiconductor chip that is different from the first semiconductor chip 260 and the second semiconductor chip 270.

Figure 14:
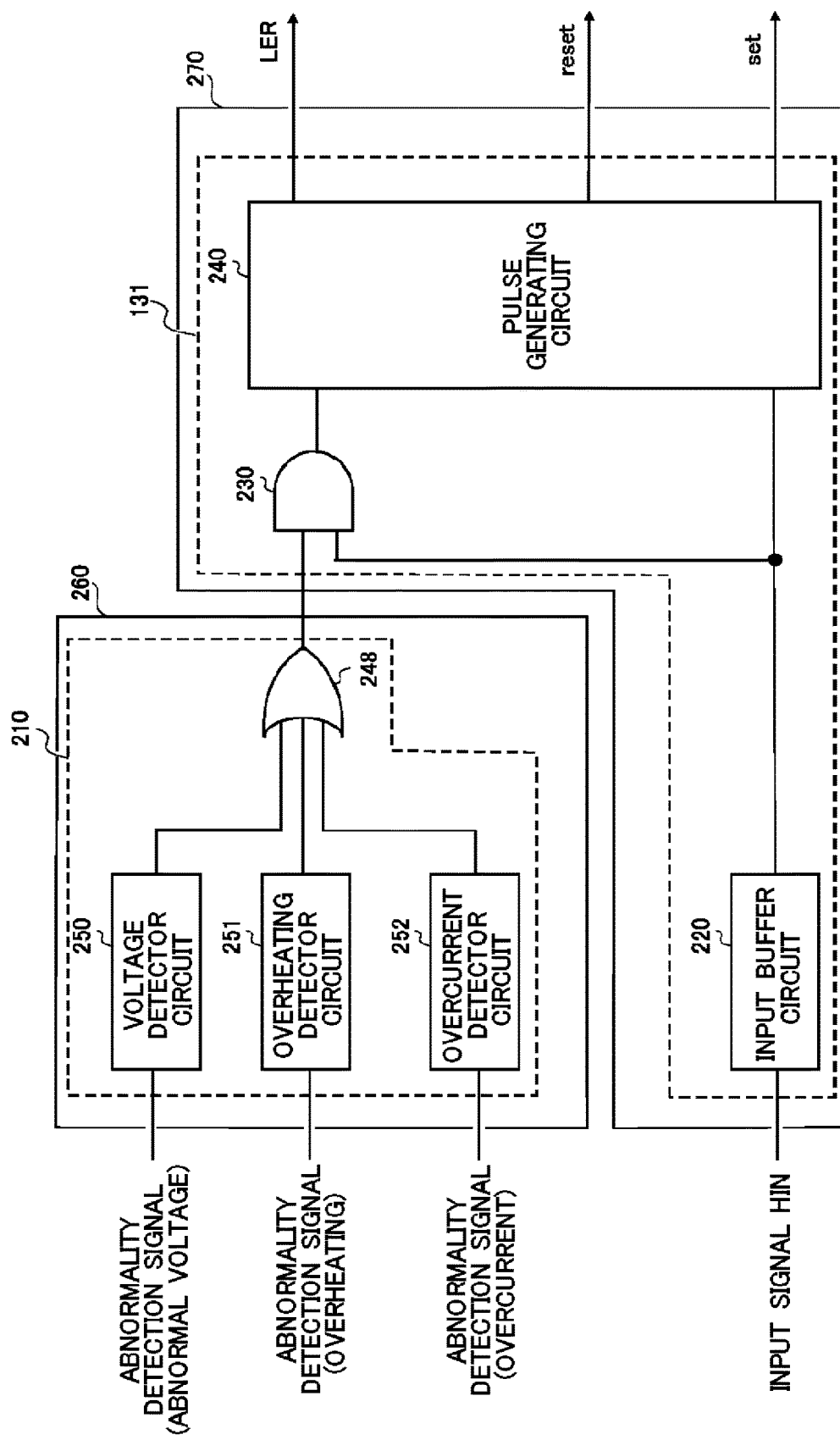
FIG. 14 shows a second modification example of the preceding-stage circuit 200.

FIG. 14 shows a second modification example of the preceding-stage circuit 200, or a preceding-stage circuit 204. In the present example, the first semiconductor chip 260 includes the voltage detector circuit 250, the overheating detector circuit 251, the overcurrent detector circuit 252 and the OR logic circuit 248. The second semiconductor chip 270 includes the input buffer circuit 220, the AND logic circuit 230, and the pulse generating circuit 240. As described above, the structures of the first semiconductor chip 260 and the second semiconductor chip 270 are different between the first modification example and the second modification example. Note that, however, the respective circuits have the above-described capabilities.

Figure 15:
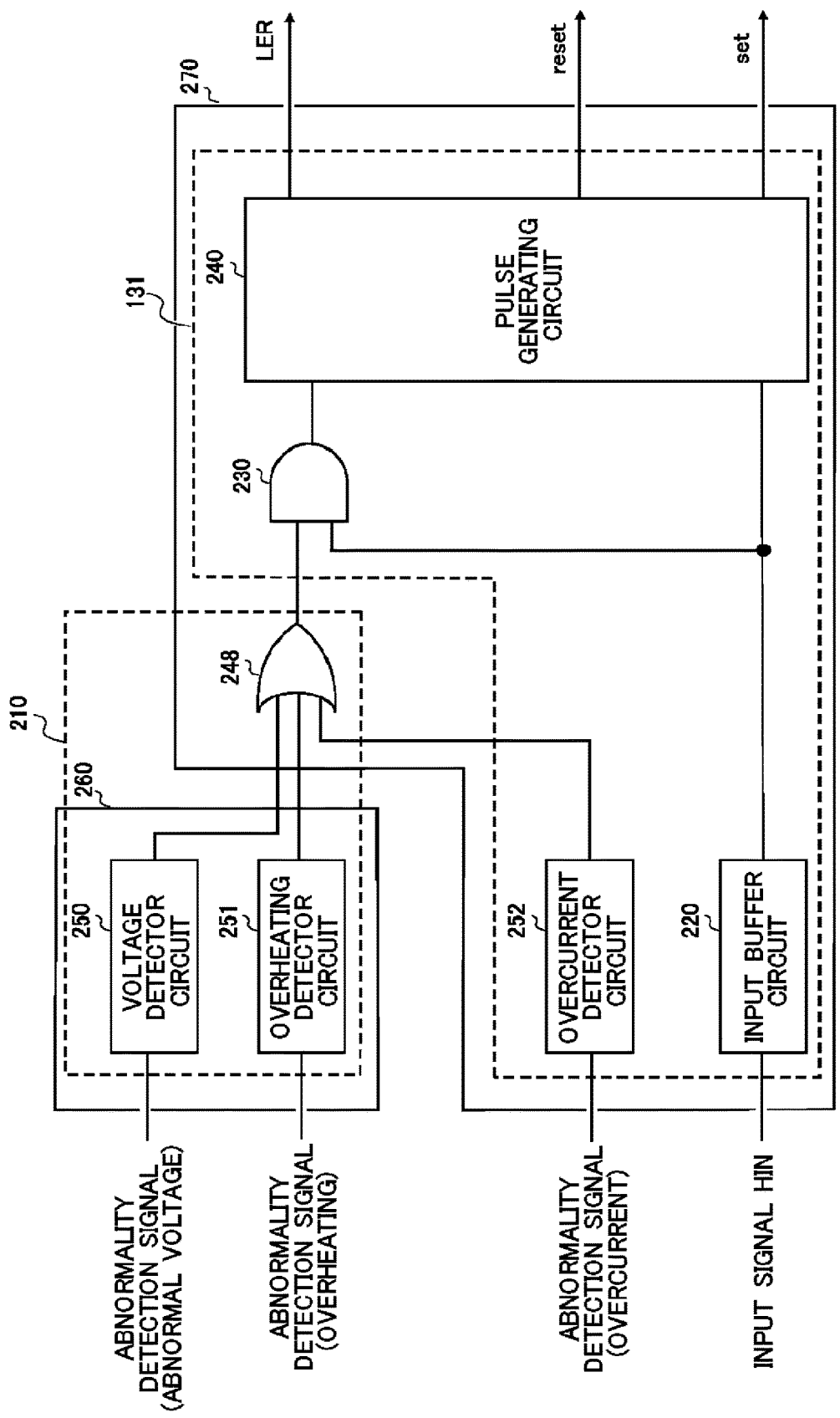
FIG. 15 shows a third modification example of the preceding-stage circuit 200.

FIG. 15 shows a third modification example of the preceding-stage circuit 200, or a preceding-stage circuit 206. In the present example, the first semiconductor chip 260 includes the voltage detector circuit 250 and the overheating detector circuit 251. The second semiconductor chip 270 includes the overcurrent detector circuit 252, the input buffer circuit 220, the OR logic circuit 248, the AND logic circuit 230 and the pulse generating circuit 240. As described above, the structures of the first semiconductor chip 260 and the second semiconductor chip 270 are different in the third modification example from the first and second modification examples. Note that, however, the respective circuits have the above-described capabilities.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

DESCRIPTION OF REFERENCE NUMERALS

12 . . . set signal input terminal, 14 . . . reset signal input terminal, 16 . . . state signal input terminal, 22 . . . AND logic circuit, 23 . . . RS latch circuit, 25 . . . timer circuit, 26 . . . RS latch circuit, 27 . . . AND logic circuit, 28 . . . controller, 29 . . . inverter circuit, 32 . . . high-side driver, 34 . . . transistor, 35 . . . power source, 36 . . . p-channel MOSFET, 37 . . . n-channel MOSFET, 38 . . . n-channel MOSFET, 40 . . . state signal input circuit, 42 . . . resistance element, 44 . . . diode, 45 . . . diode, 46 . . . transistor, 47 . . . drain, 48 . . . parasitic capacitance, 49 . . . source, 50 . . . set signal input circuit, 52 . . . resistance element, 54 . . . diode, 55 . . . diode, 56 . . . transistor, 57 . . . drain, 58 . . . parasitic capacitance, 59 . . . source, 60 . . . reset signal input circuit, 62 . . . resistance element, 64 . . . diode, 65 . . . diode, 66 . . . transistor, 67 . . . drain, 68 . . . parasitic capacitance, 69 . . . source, 70 . . . level shift circuit, 72 . . . low-side driver, 74 . . . transistor, 76 . . . power source, 80 . . . load, 82 . . . power source, 85 . . . inverter circuit, 86 . . . inverter circuit, 87 . . . inverter circuit, 90 . . . anti-error circuit, 91 . . . AND logic circuit, 92 . . . AND logic circuit, 93 . . . AND logic circuit, 96 . . . OR logic circuit, 100 . . . driving circuit, 120 . . . high-side control circuit, 130 . . . low-side control circuit, 131 . . . driving control circuit, 140 . . . microcomputer, 200 . . . preceding-stage circuit, 202 . . . preceding-stage circuit, 204 . . . preceding-stage circuit, 206 . . . preceding-stage circuit, 210 . . . abnormality detecting circuit, 211 . . . comparator, 212 . . . reference power source, 213 . . . noise filter, 220 . . . input buffer circuit, 221 . . . comparator, 222 . . . reference power source, 223 . . . noise filter, 230 . . . AND logic circuit, 240 . . . pulse generating circuit, 241 . . . rising differential pulse generating circuit, 242 . . . delay circuit, 243 . . . AND logic circuit, 244 . . . AND logic circuit. 245 . . . falling differential pulse generating circuit, 247 . . . rising differential pulse generating circuit, 248 . . . OR logic circuit. 250 . . . voltage detector circuit, 251 . . . overheating detector circuit, 252 . . . overcurrent detector circuit, 260 . . . first semiconductor chip, 270 . . . second semiconductor chip

What is claimed is:

1. A driving circuit comprising:
a level shift circuit configured to convert an input signal from a preceding-stage circuit into a signal having a higher voltage than the input signal; and
a controller configured to output a signal to allow a first switch element to perform a soft shutdown based on an output signal from the level shift circuit, wherein
the driving circuit is configured to drive the first switch element,
the preceding-stage circuit includes an abnormality detecting circuit,
the controller determines whether the first switch element is to perform the soft shutdown based on an output signal from the abnormality detecting circuit,
the first switch element is switched on or off according to a control signal input thereinto,
the driving circuit further comprises a latch circuit configured to generate the control signal according to a set signal and a reset signal that are input from the preceding-stage circuit to the level shift circuit, and
the controller determines whether the first switch element is to perform the soft shutdown based on an output from the latch circuit and a state signal generated based on the output signal from the abnormality detecting circuit.

2. The driving circuit as set forth in claim 1, wherein the controller allows the first switch element to perform the soft shutdown when the output signal from the latch circuit indicates that the first switch element is to be switched on and the state signal indicates that abnormality is detected in the preceding-stage circuit.

3. The driving circuit as set forth in claim 1, wherein the set signal indicates a predetermined logical value when the first switch element is to be switched on,
the reset signal indicates a first predetermined logical value when the first switch element is to perform a hard shutdown,
the state signal indicates a second predetermined logical value when abnormality is detected in the preceding-stage circuit, and
the driving circuit further comprises an anti-error circuit configured to, except when the first switch element performs the soft shutdown, maintain the first switch element switched on or off when two or more of the set signal, the reset signal and the state signal indicates the first and second predetermined logical values.

4. The driving circuit as set forth in claim 1, wherein the level shift circuit includes a state signal input circuit configured to shift a level of the state signal, a set signal input circuit configured to shift a level of the set signal and a reset signal input circuit configured to shift a level of the reset signal,
the state signal input circuit, the set signal input circuit and the reset signal input circuit each include a resistance element connected to a high-potential side of the driving circuit and a transistor having a drain connected to a low-potential side of the resistance element,
in the state signal input circuit, the set signal input circuit and the reset signal input circuit,
high-potential sides of the resistance elements are connected to each other and
the resistance elements have a same resistance value and the transistors have a same characteristic.

5. The driving circuit as set forth in claim 1, wherein the controller controls the first switch element to start a hard shutdown after a predetermined period of time has elapsed after the first switch element starts the soft shutdown.

6. The driving circuit as set forth in claim 1, wherein the preceding-stage circuit includes a low-side control circuit configured to switch on or off a second switch element that is connected in series with a low-potential side of the first switch element, wherein
the abnormality detecting circuit includes a circuit configured to detect a state of the second switch element.

7. A driving circuit comprising:
a level shift circuit configured to convert an input signal from a preceding-stage circuit into a signal having a higher voltage than the input signal; and
a controller configured to output a signal to allow a first switch element to perform a soft shutdown based on an output signal from the level shift circuit, wherein
the driving circuit is configured to drive the first switch element,
the preceding-stage circuit includes an abnormality detecting circuit,
the controller determines whether the first switch element is to perform the soft shutdown based on an output signal from the abnormality detecting circuit, and the preceding-stage circuit determines whether the first switch element is to perform the soft shutdown based on a signal input from outside and designed to control the first switch element and the output signal from the abnormality detecting circuit.

8. The driving circuit as set forth in claim 7, wherein the preceding-stage circuit outputs to the level shift circuit a state signal designed to allow the first switch element to perform the soft shutdown when the signal input from outside and designed to control the first switch element indicates that the first switch element is to be switched on and the output signal from the abnormality detecting circuit indicates that abnormality is detected.

9. A driving circuit comprising:
a level shift circuit configured to convert an input signal from a preceding-stage circuit into a signal having a higher voltage than the input signal; and
a controller configured to output a signal to allow a first switch element to perform a soft shutdown based on an output signal from the level shift circuit, wherein
the driving circuit is configured to drive the first switch element,
the controller controls the first switch element to start a hard shutdown after a predetermined period of time has elapsed after the first switch element starts the soft shutdown, and
the controller determines the predetermined period of time depending on a type of an abnormality detected in the preceding-stage circuit.

10. A driving circuit comprising:
a level shift circuit configured to convert an input signal from a preceding-stage circuit into a signal having a higher voltage than the input signal; and
a controller configured to output a signal to allow a first switch element to perform a soft shutdown based on an output signal from the level shift circuit, wherein
the driving circuit is configured to drive the first switch element,
the controller controls the first switch element to start a hard shutdown after a predetermined period of time has elapsed after the first switch element starts the soft shutdown, and
the controller determines a time constant of the soft shutdown depending on a type of an abnormality detected in the preceding-stage circuit.

* * * * *